(12) United States Patent
Haacke et al.

(10) Patent No.: US 11,435,424 B1
(45) Date of Patent: Sep. 6, 2022

(54) SYSTEMS AND METHODS OF CONSTRAINED RECONSTRUCTION OF IMAGES WITH WHITE NOISE

(71) Applicant: SPINTECH, INC., Bingham Farms, MI (US)

(72) Inventors: Ewart Mark Haacke, Detroit, MI (US); Paul David Kokeny, Madison Heights, MI (US)

(73) Assignee: SPINTECH, INC., Bingham Farms, MI (US)

( * ) Notice: Subject to any disclaimer, the term of this patent is extended or adjusted under 35 U.S.C. 154(b) by 0 days.

(21) Appl. No.: 17/459,482

(22) Filed: Aug. 27, 2021

(51) Int. Cl.
    *G01N 33/48*     (2006.01)
    *G01R 33/56*     (2006.01)
    *G01R 33/565*     (2006.01)
    *G01R 33/561*     (2006.01)

(52) U.S. Cl.
    CPC ....... *G01R 33/5608* (2013.01); *G01R 33/561* (2013.01); *G01R 33/565* (2013.01)

(58) Field of Classification Search
    CPC .............. G01R 33/3415; G01R 33/543; G01R 33/5659; G01R 33/36; A61B 5/055
    USPC .......................................................... 702/19
    See application file for complete search history.

(56) References Cited

U.S. PATENT DOCUMENTS

| | | | | |
|---|---|---|---|---|
| 7,547,283 | B2 * | 6/2009 | Mourad | A61B 5/031 600/459 |
| 7,817,838 | B2 | 10/2010 | DiBella et al. | |
| 2008/0197844 | A1 | 8/2008 | Ying et al. | |
| 2011/0044524 | A1 | 2/2011 | Wang et al. | |
| 2013/0053658 | A1 * | 2/2013 | Peacock | A61B 5/055 600/309 |
| 2014/0132261 | A1 | 5/2014 | Kim et al. | |
| 2015/0331972 | A1 * | 11/2015 | McClure | G06F 17/11 703/2 |

FOREIGN PATENT DOCUMENTS

| | | | | |
|---|---|---|---|---|
| CA | | 2276603 A1 * | 12/2000 | ........... G01R 33/446 |
| CN | | 109917314 A * | 6/2019 | ......... G01R 33/5602 |
| WO | WO-2014/165050 A1 | | 10/2014 | |

OTHER PUBLICATIONS

International Search Report and Written Opinion for PCT Appl. No. PCT/US2021/048044, dated Dec. 16, 2021.

* cited by examiner

*Primary Examiner* — Walter L Lindsay, Jr.
(74) *Attorney, Agent, or Firm* — Foley & Lardner LLP

(57) ABSTRACT

A magnetic resonance imaging (MRI) system can include a processor and a memory. The processor can receive an acquired magnetic resonance (MR) dataset having a first signal-to-noise ratio (SNR). The processor can extract, from the acquired MR dataset, a first set of values corresponding to a first variable having a second SNR and a second set of values corresponding to a second variable. The processor can apply a constraint function that includes a function of the first variable and the second variable. The processor can minimize a cost function according to the constraint function to generate a cost function solution. The processor can input the first variable and the second variable into the cost function solution to generate a modified first variable having a third SNR, the third SNR being greater than the second SNR.

22 Claims, 21 Drawing Sheets

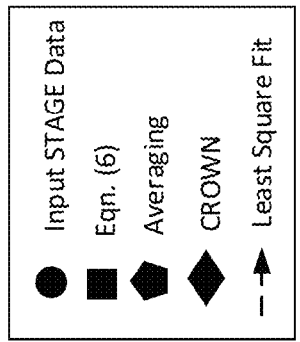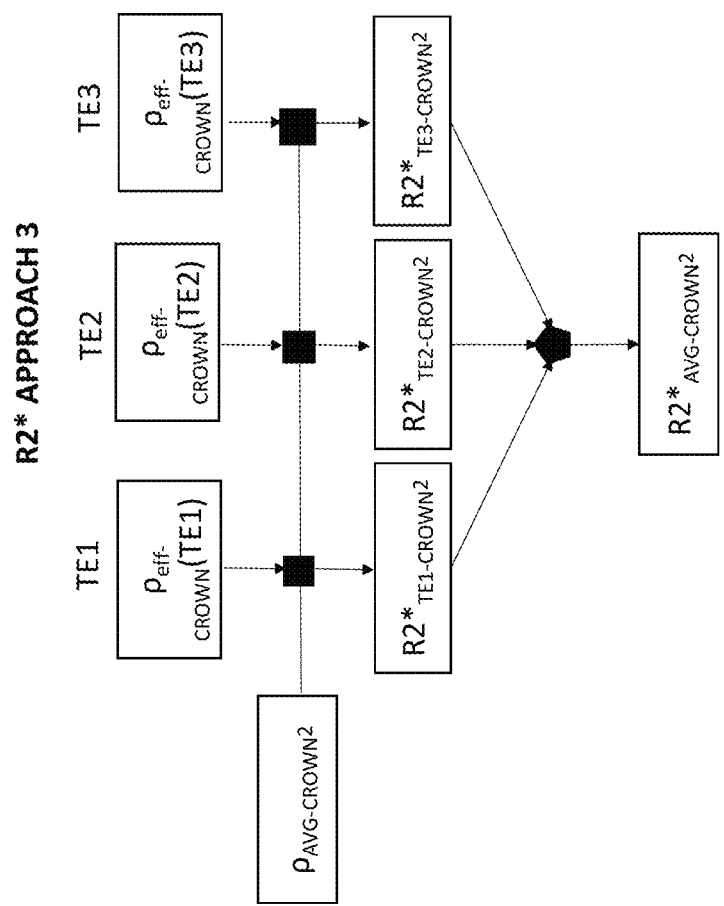
FIG. 8

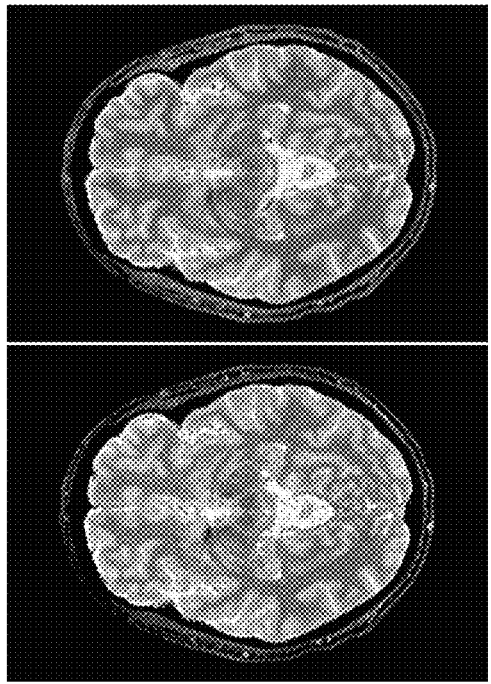
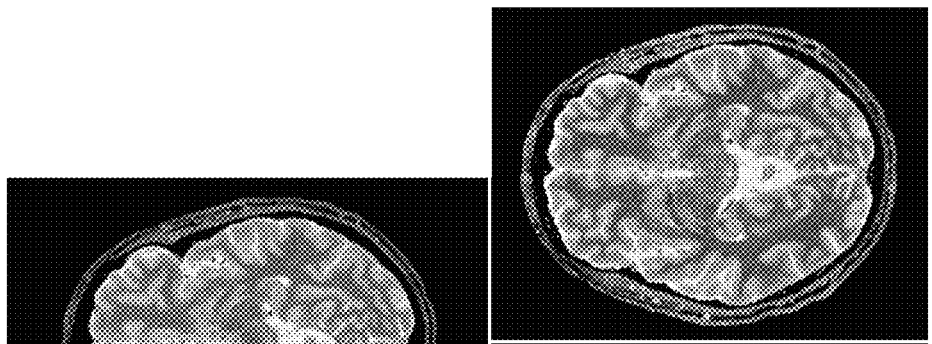
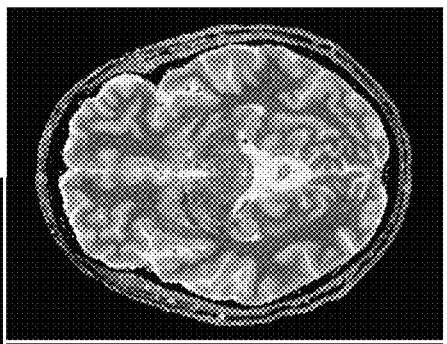
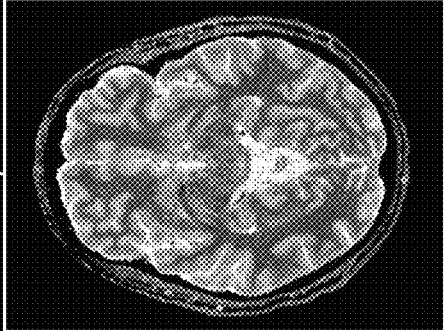
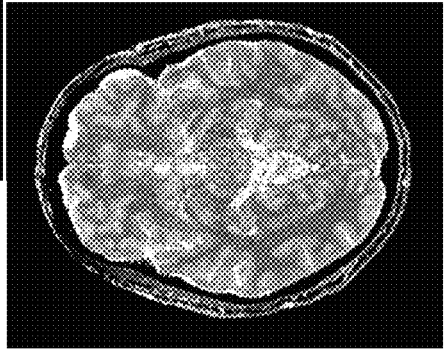

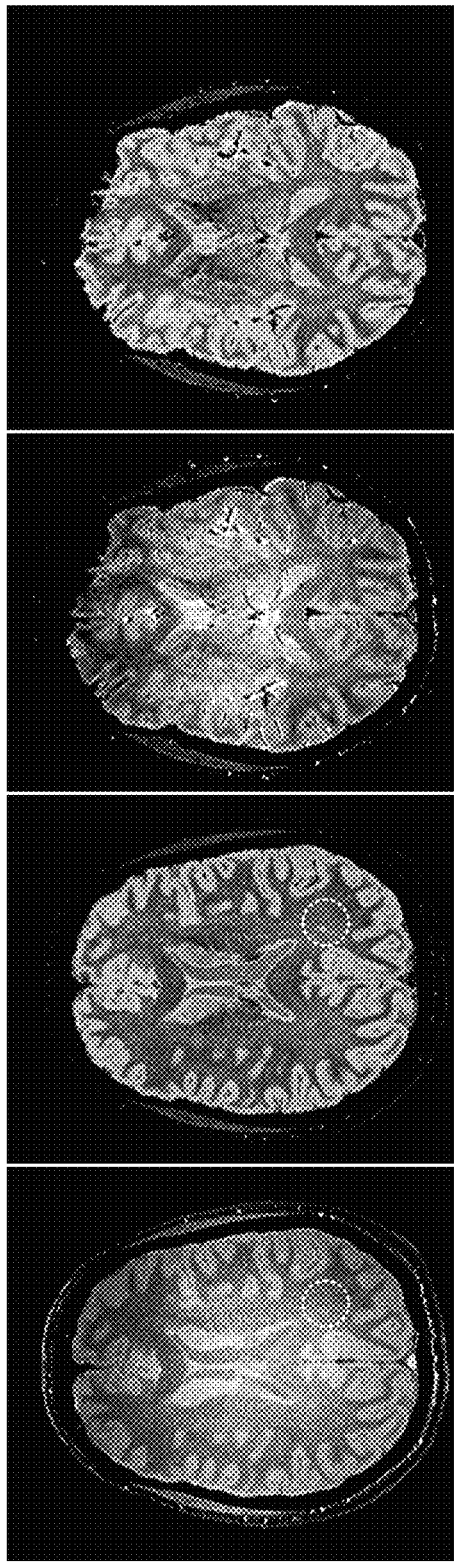
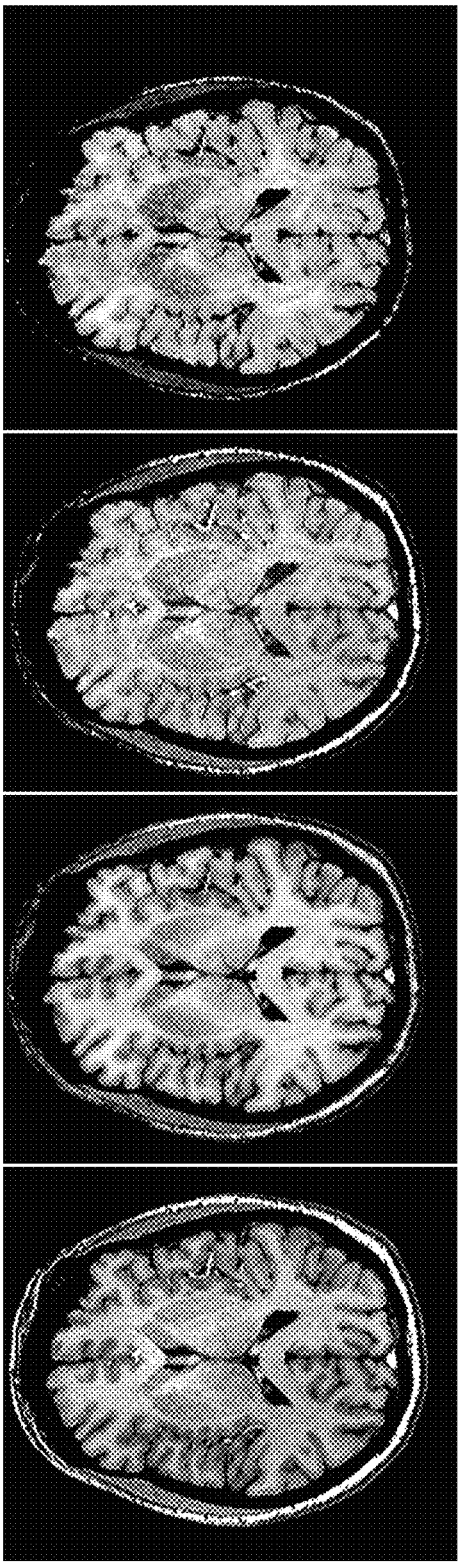
FIG. 14A  FIG. 14B  FIG. 14C  FIG. 14D
FIG. 14E  FIG. 14F  FIG. 14G  FIG. 14H

SYSTEMS AND METHODS OF CONSTRAINED RECONSTRUCTION OF IMAGES WITH WHITE NOISE

BACKGROUND

Magnetic resonance imaging (MRI) is an accepted modality for imaging soft tissue in the human body as well as in animals and some materials. Mill is intrinsically inefficient in that at room temperatures the available magnetization is limited. The more spins that can be polarized, the better the signal-to-noise ratio (SNR) of the imaging will be. For this reason, the MM field has pushed the limits of high field human imaging from 3 T to 7 T and more recently to almost 12 T. Reasons to increase the magnetic field can include better SNR, better resolution, faster imaging, novel contrast mechanisms, and better spectral resolution. However, problems with imaging at a high magnetic field can include high costs, increased power deposition, and decreased susceptibility effects for a given echo time. This can lead to the need for greater gradient strengths to compensate for bad local fields. Under these conditions, the SNR can be expected only to increase with the square root of the main field strength. One of the main goals in MRI research today is to find ways to increase the SNR through signal processing means and bypass the need for higher field strengths and their associated higher expense.

SUMMARY

Systems and methods for constrained reconstruction of images with white noise (CROWN) can offer a powerful solution to improve SNR without modifying or blurring the image structures as is the case in most other methods that purport to improve SNR. CROWN can lead to improved SNR for proton spin density (PD) estimates, images for any arbitrary flip angles, and images for any other MRI pulse sequences which can be derived from knowledge of T1, PD, and T2*. CROWN can operate in conjunction with strategically acquired gradient echo (STAGE) imaging, any other multi-flip angle approach, or any method that generates both a spin density map and T1 map. CROWN can be used in low field strength applications where the SNR is inherently limited. CROWN can also be applied in any system where two variables are related.

At least one aspect of the present disclosure is directed to a magnetic resonance imaging (Mill) system. The Mill system can include a processor and a memory. The processor can receive an acquired magnetic resonance (MR) dataset having a first signal-to-noise ratio (SNR). The processor can extract, from the acquired MR dataset, a first set of values corresponding to a first variable having a second SNR and a second set of values corresponding to a second variable. The processor can apply a constraint function that includes a function of the first variable and the second variable. The processor can minimize a cost function according to the constraint function to generate a cost function solution. The processor can input the first variable and the second variable into the cost function solution to generate a modified first variable having a third SNR, the third SNR being greater than the second SNR.

Another aspect of the present disclosure is directed to a method of magnetic resonance imaging. The method can include receiving, by at least one processor, an acquired MR dataset having a first SNR. The method can include extracting, from the acquired MR dataset by the at least one processor, a first set of values corresponding to a first variable having a second SNR and a second set of values corresponding to a second variable. The method can include using, by the at least one processor, a constraint function that includes a function of the first variable and the second variable. The method can include minimizing, by the at least one processor, a cost function according to the constraint function to generate a cost function solution. The method can include inputting, by the at least one processor, the first variable into the cost function solution to generate a modified first variable having a third SNR, the third SNR being greater than the second SNR.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

The details of one or more implementations of the subject matter described in this specification are set forth in the accompanying drawings and the description below. Other features, aspects, and advantages of the subject matter will become apparent from the description, the drawings, and the claims.

FIG. 8 illustrates a flow chart for calculating $R2^*_{AVG\text{-}CROWN^2}$ using CROWN processing, according to an embodiment.

FIGS. 9A-9E illustrate $\rho_{eff}$ maps and ρ maps depicted in FIGS. 3A-3C and FIGS. 4-8, according to an embodiment.

FIGS. 14A-14H illustrate the efficacy of CROWN processing for forward simulating data, according to an embodiment.

Like reference numbers and designations in the various drawings indicate like elements.

DETAILED DESCRIPTION

Figure 1:
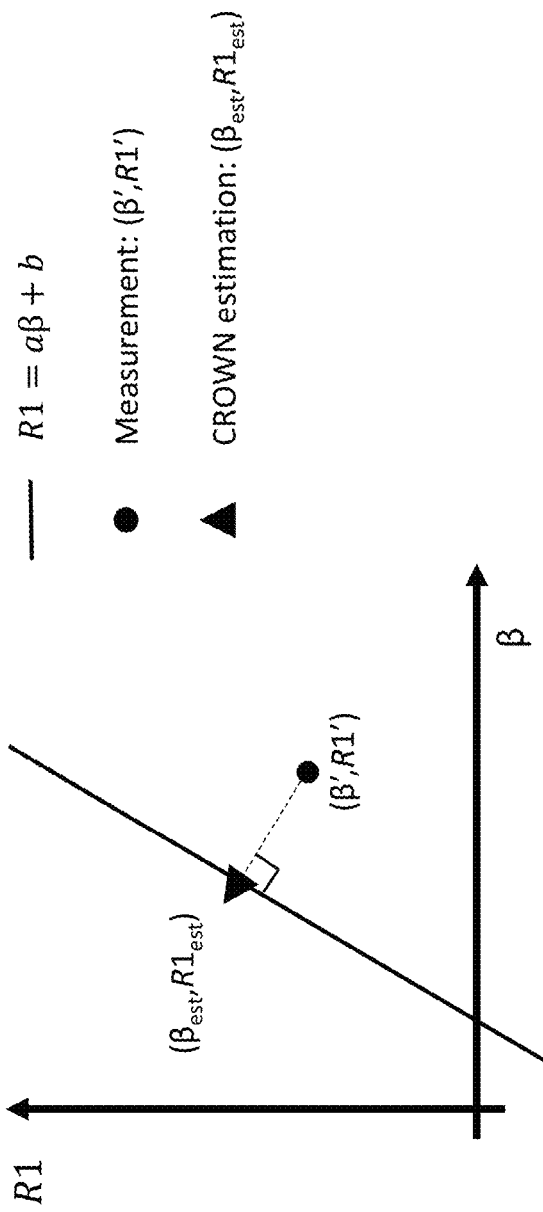
FIG. 1 illustrates a plot of the minimization of the cost function for one point, according to an embodiment.

Following below are more detailed descriptions of various concepts related to, and implementations of, methods, apparatuses, and systems for the constrained reconstruction of images with white noise. The various concepts introduced above and discussed in greater detail below may be implemented in any of a number of ways, as the described concepts are not limited to any particular manner of implementation. Examples of specific implementations and applications are provided primarily for illustrative purposes.

One way to improve the SNR is to average the data. However, acquiring the data N times can take N times longer but only give an improvement in the SNR of $\sqrt{N}$. Therefore, fewer patients can be scanned clinically because the MII scans take longer. Another way to improve the SNR is to filter the data. For example, a Hanning filter can remove Gibbs ringing and improve the SNR. However, this approach leads to blurring of the image (e.g., loss of resolution). Usual (e.g., conventional) approaches to improving the SNR and, hence, image quality without destroying the resolution in the process can include using an edge preserving filter. This can be accomplished in a variety of ways to keep the high spatial frequency components in the image. Suppressing high k-space signals, as is done with the Hanning filter, may not be desired. An anisotropic diffusion filter (ADF) can be used to improve the SNR. Although the ADF can preserve the edges when the SNR is high, the ADF still blurs the images to some degree. Some techniques use artificial intelligence to reduce noise by training different models. However, these models may be trained using a single type of contrast and only work for that contrast. These models may need to be trained over hundreds or thousands of cases every time contrast is changed. These algorithms can lead to some degradation of the image which is recognizable as a remnant blurring relative to the original data.

In the present disclosure, systems and methods for constrained reconstruction of images with white noise (e.g., CROWN, CROWN processing, etc.) are described. CROWN can allow for enhanced (e.g., improved) SNR without loss of detail by using constraints. CROWN can be used with strategically acquired gradient echo (STAGE) imaging, which is described below. However, CROWN can be used for any approach which can generate spin density (e.g., water content) and T1 maps. More generally, CROWN can be used for any system and/or method that collects two or more images that are functionally related to each other through two or more variables. CROWN can be used to improve SNR without loss of image resolution.

STAGE imaging can include a rapid, multi-contrast, multi-echo, gradient echo imaging method. It can use at least two flip angles to estimate proton spin density (PD) and T1 (e.g., longitudinal relaxation time) maps. Generally, in MRI, water content (e.g., PD) drives T1 and T2*. Therefore, a relationship (e.g., linear relationship) between water content and T1 or water content and T2* can be determined (e.g., written, specified, formed, etc.). The relationship can be used to reduce the noise level in the PD image and/or generate higher quality simulated images for any flip angle for a given echo time. CROWN can be applied to data with low SNR and can improve data collected with high parallel imaging acceleration factors, high resolution, or from radiofrequency receive coils (e.g., RF coils) with a small number of channels. In addition, CROWN processing can be extremely fast compared to conventional methods and can reduce the white noise level without degrading the edges or image details in general.

The relationship between variables can be used to constrain the data (e.g., MM data) in a way that reduces noise. For example, this can include a relationship between a spin density, $$\text{PD} = \frac{1}{\beta},$$

and longitudinal relaxation time, $$T1 = \frac{1}{R1}.$$

The relationship between spin density and T1 can be used to constrain the data in a way that reduces noise.

Consider, for example, the following linear relationship described by Equation 1:

$$R1 = \alpha\beta + b \tag{1}$$

STAGE can collect two datasets. Each of the datasets can have noise. This in turn can lead to noise being generated in both the spin density map and the T1 map. Often the spin density maps can be quite noisy, especially after correcting for T2*(1/R2*) using a separate T2* map that also has noise. A map (e.g., spin density map, T1 map, etc.) can include a set of values of the variable (e.g., spin density, T1, etc.) at points throughout the image. For example, a spin density map can indicate the value of the spin density at each pixel.

The SNR in the spin density image can be enhanced using CROWN processing. To accomplish this, the following cost function described in Equation 2 can be determined to calculate the estimated point (R1$_{est}$, β$_{est}$) from the measured data (R1', β'):

$$C(\beta, R1) = \min((\beta - \beta')^2 + (R1 - R1')^2) \tag{2}$$

Substituting R1 from Equation 1 yields Equation 3:

$$C(\beta, R1) = \min((\beta - \beta')^2 + ((\alpha\beta + b) - R1')^2) \tag{3}$$

Taking the derivative of C(β, R1) with respect to and setting it equal to zero yields Equation 4 and Equation 5:

$$\beta_{est} = \frac{\beta' + a(R1' - b)}{(1 + a^2)} \tag{4}$$

$$R1_{est} = a \cdot \beta_{est} + b \tag{5}$$

These predicted values (e.g., β$_{est}$ and R1$_{est}$) can include projections of the values (R1', β') onto (R1, β) which fall on the line represented by Equation 1. These new values of (R1$_{est}$, β$_{est}$) represent the new CROWN values. The relationship between R1 (1/T1) and μ (1/ρ) can be modified for different TE. As TE changes, the "effective" spin density, $\rho_{\text{eff}}$, described in Equation 6 changes accordingly.

$$\rho_{\text{eff}}(TE) = \rho \cdot e^{-TE \cdot R2*} \tag{6}$$

The effect of the minimization for one point is graphically/geometrically shown in FIG. 1. FIG. 1 illustrates a plot of the minimization of the cost function for one point. A graphical representation of the minimization of the cost function (e.g., Equation 2) is shown. Once the linear relationship between β and R1 has been determined, any measurement point with noise (β', R1') that lies outside the line can be mapped back to its estimate ($\beta_{est}$, $R1_{est}$) using the proposed solution (e.g., cost function solution) to the cost function of Equation 2.

Figure 2:
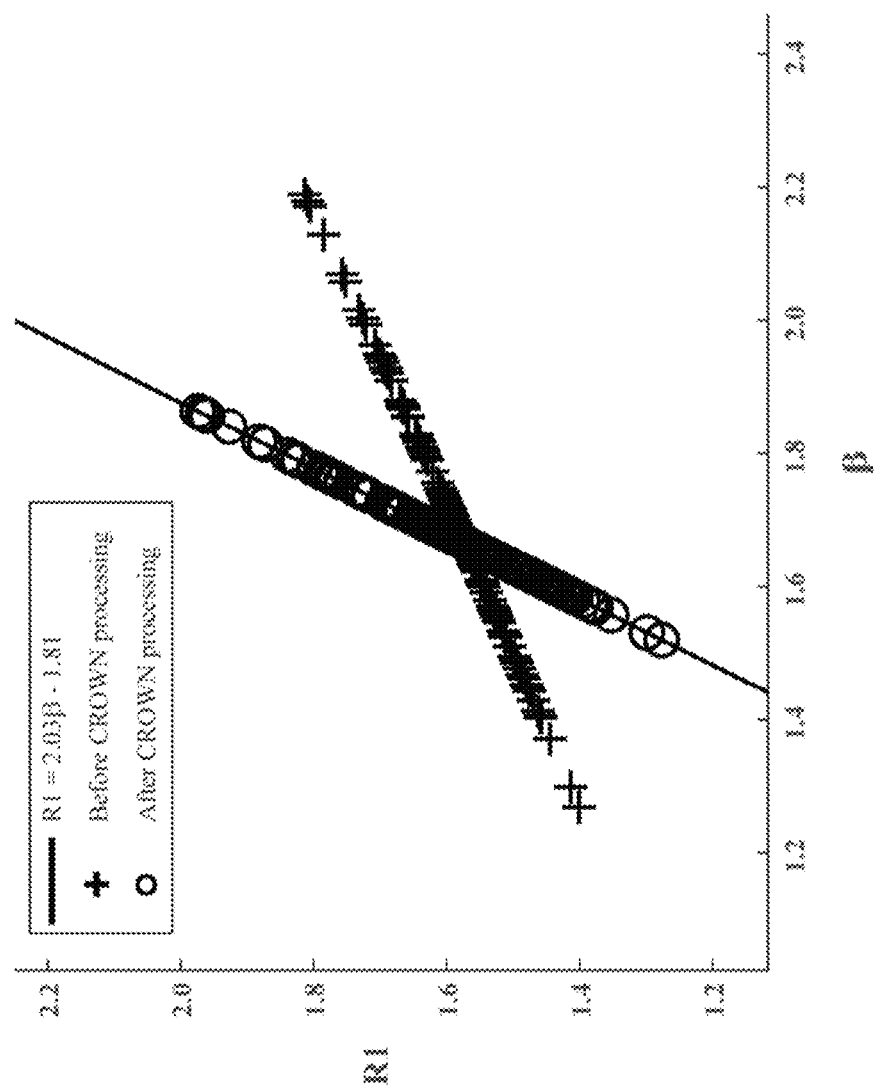
FIG. 2 illustrates a plot of the minimization of the cost function for multiple points, according to an embodiment.

The effect of the minimization for multiple points is graphically/geometrically shown in FIG. 2. FIG. 2 illustrates a plot of the minimization of the cost function for multiple points. A graphical representation of the linear relationship between R1 and β representing Equation 1 and the projection of noisy measurements (crosses) to their estimates (circles) to the line after CROWN processing is shown.

To apply CROWN, the linear coefficients a and b from Equation 1 can be determined. Assumptions about the tissue parameters of T1, spin density, and T2* (e.g., if effective spin density is desired) in the brain's white matter (WM), gray matter (GM), and cerebrospinal fluid (CSF) can be made. The values used for 3T field strength are shown in Table 1.

| Tissue | T1 (ms) | ρ | T2* (ms) |
|--------|---------|------|----------|
| CSF | 4500 | 1 | 2000 |
| GM | 1611 | 0.84 | 60 |
| WM | 850 | 0.68 | 53 |

Table 1 illustrates assumed tissue parameter values at 3T to determine CROWN coefficients.

These values can provide three sample points on the (β, R1) axes which can be used to perform a linear regression and extract the slope a and intercept b. In this case, the line can be fit by forcing the regression line to pass through the point representing CSF. With TE=0 ms (e.g., no T2* effects) the coefficients a and b can be 2.03/sec and −1.81/sec respectively. To take T2* effects into account, values for spin density can be adjusted by the factor $E2* = e^{(-TE/T2*)}$, and linear regression can be re-performed using the new coefficients for different TE provided in Table 2.

| TE (ms) | Relation between R1 and β where R1 and β have units 1/sec |
|---------|-----------------------------------------------------------|
| 0 | R1 = 2.03β − 1.81 |
| 7.5 | R1 = 1.3β − 1.08 |
| 15 | R1 = 0.93β − 0.71 |
| 22.5 | R1 = 0.69β − 0.47 |
| 6.25 | R1 = 1.39β − 1.17 |
| 10.14 | R1 = 1.15β − 0.93 |

Table 2 illustrates the relationship between R1 and β for different echo times. The linear relationship between R1 and β can be chosen based on the echo time for multi-echo STAGE images.

An issue that can be addressed before applying CROWN is that the spin density map values generated from STAGE are scaled arbitrarily while the CROWN coefficients can be determined by representing spin density as a unitless percentage on a scale of 0 to 1. Thus, the spin density maps can be normalized to the CSF, which can be assumed to have a spin density of unity (e.g., the maximum spin density is assumed to be water and is normalized to 1.0). Another issue that can be addressed before applying CROWN is that CSF values in both the T1 and spin density maps from STAGE can be noisy. This can be a by-product of only using two flip angles (e.g., one flip angle roughly equal to and the other flip angle greater than the Ernst angle of CSF) to generate these maps. The following procedure can address these issues.

The CSF can be used to normalize the spin density to a unitless measure of water on a scale of 0 to 1 (since CSF is 100% water). To determine the required scale value and normalize the entire PD map, the location of CSF pixels in the ventricles can be determined using a T1 map. This can be achieved through the following approaches. First, a T1 threshold of CSF within a middle slab of the field of view (FOV) can be used to do this. Using a slab rather than the entire 3D dataset can help avoid any global variations of spin density across the data. The slab can consist of enough slices to effectively guarantee the ventricles will reside within it. For the typical STAGE brain scan FOV of 256 mm×192 mm×128 mm, assuming the subject is properly centered, the central 20 mm of the FOV can capture the ventricles. To reduce global variations in the effective spin density and ensure CSF spin density is unity throughout the brain, radiofrequency (RF) penetration effects and RF receive coil effects can be removed using STAGE. As an alternative approach, to ensure that the region that is used to normalize the spin density has the best possible signal-to-noise, the maximum value of the sum of correlating a 3D object with dimensions a×b×c (e.g., where a×b could be 20 mm×20 mm and c could be 10 mm) where each pixel has a value of unity with the T1 map either in the vertical direction above and below the center slice or throughout the entire object can be determined. This process can choose the region-of-interest (ROI) that has the most pixels with CSF (e.g., an ROI centered around on the ventricles.) This approach can ensure that only the ventricles are captured and not any of the cortical CSF. Mathematically, this can be described by Equation 7:

$$r_{csf} = \text{argmax}_r \{W(r) * T1(r)\} \tag{7}$$

where W(r) represents the a×b×c 3D rectangular box, with a value of 1 inside and a value of 0 outside, T1(r) is the T1 map, * is the convolution operator, and argmax$_r$ returns the value of r that maximizes the value inside the brackets. Thus $r_{csf}$ can be the location of the box that provides the highest value of the convolution, which is expected to represent predominantly the ventricles, assuming that the box is large enough to contain them all.

$S_{CSF-MID}$ can be the set of pixel locations, $r_{i,j,k}$, inside the slab or inside the chosen ROI that also satisfy the condition {(4300 ms−ΔT1*$_{CSF}$)<T1($r_{i,j,k}$)<(4300 ms+ΔT1*$_{CSF}$)}, where ΔT1*$_{CSF}$ can be adjusted to change the width of the CSF T1 window. ΔT1*$_{CSF}$ can be 500 ms. Most of these pixels in $S_{CSF-MID}$ can be inside the ventricles. The average PD value over the set of pixels $S_{CSF-MID}$ can be taken to represent the PD scale value described by Equation 8:

$$PD_{scale} = \frac{1}{N} \sum_{r_{i,j,k} \in S_{CSF-MID}} PD(r_{i,j,k}) \tag{8}$$

where N is the number of pixel locations in $S_{CSF\text{-}MID}$. The normalized PD map can be calculated from the expression $PD_{norm}=PD/PD_{scale}$.

The poorly behaved CSF values can be identified and replaced in both the T1 and PD maps. A T1 map threshold can again be used to do this. However, rather than only identifying the bad pixels, it can be easier to capture as many CSF pixels as possible and replace them with the known CSF values plus some noise. A low pass filter of the T1 map can also be used to help capture some of the pixel locations within the ventricles which have extremely low T1 values due to the noise. $S_{CSF}$ can be the set of pixel locations, $r_{i,j,k}$, that satisfy the condition $\{T1(r_{i,j,k})>(4300\text{ ms-loffsetl}) \text{ or } LP\{T1\}(r_{i,j,k})>(4300\text{ ms-loffsetl})\}$, where LP represents a low-pass averaging filter, and "offset" can be adjusted to capture more of the CSF at the risk of including other tissues. The final T1 and PD maps can be described by Equation 9 and Equation 10:

$$T1_{CSF}(r_{i,j,k}) = \begin{cases} \aleph\{4300\text{ ms}, \sigma_{T1}\} & \text{for } r_{i,j,k} \in S_{CSF} \\ T1(r_{i,j,k}) & \text{for } r_{i,j,k} \notin S_{CSF} \end{cases} \quad (9)$$

$$T1_{CSF}(r_{i,j,k}) = \begin{cases} \aleph\{1.0, \sigma_{PD}\} & \text{for } r_{i,j,k} \in S_{CSF} \\ PD_{norm}(r_{i,j,k}) & \text{for } r_{i,j,k} \notin S_{CSF} \end{cases} \quad (10)$$

where $\aleph\{M, \sigma\}$ represents a normally distributed random variable with mean M and standard deviation $\sigma$. The values of $\sigma_{T1}$ and $\sigma_{PD}$ can be chosen to best match the noise in the rest of each corresponding map. Values of 50 ms and 0.03 for $\sigma_{T1}$ and $\sigma_{PD}$, respectively, can work well with a variety of STAGE data from different scanners. These values can require adjustment for data with very high or very low SNR when the result from the synthetic noise looks unnatural. This same process could also be applied using an averaging filter on the original T1 and PD data with kernel size 3×3×1, for example, as input to increase the SNR. After CROWN is performed on the corrected and normalized data, the new spin density maps can be labeled with the subscript CROWN (e.g., $\rho_{eff\text{-}CROWN}$). This CROWN PD result, $\rho_{eff\text{-}CROWN}$, can have values between zero and unity. The final CROWN PD result, $\rho_{CROWN}$, can have values between zero and unity.

Improved $\rho$ and R2* can be generated using CROWN. Improved $\rho$ maps (e.g., with no R2* weighting) and R2* maps can be generated in a variety of different ways. The conventional STAGE method of generating these maps and three different methods to generate improved $\rho$ and R2* maps with CROWN are described.

Figure 3A:
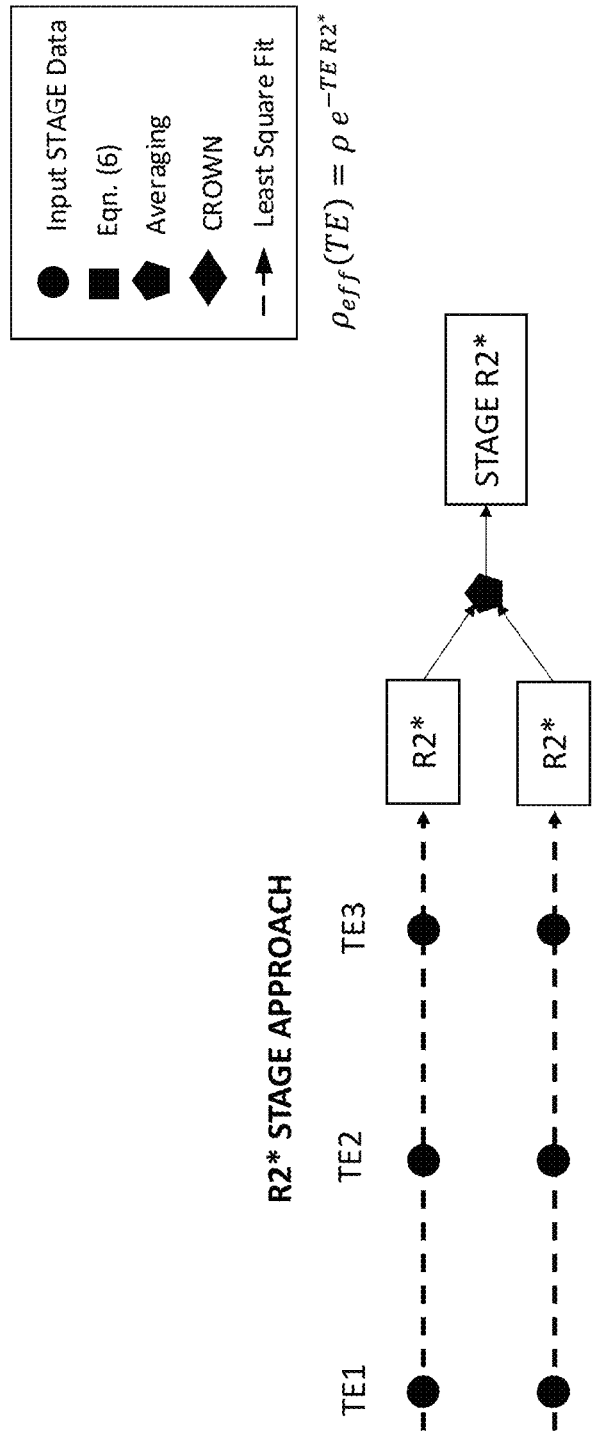
FIG. 3A illustrates a flow chart for calculating R2* using STAGE, according to an embodiment.
Figure 3B:
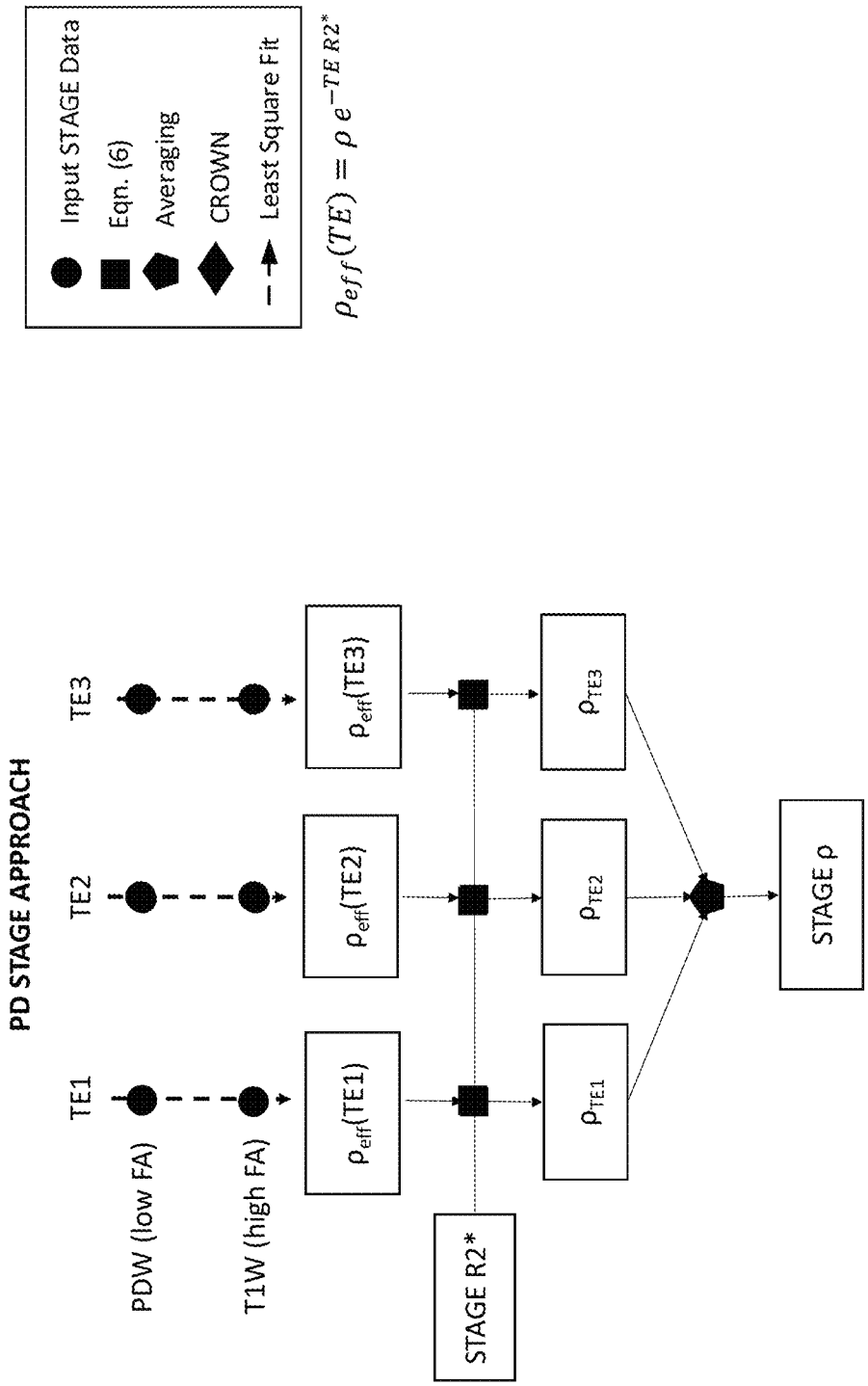
FIG. 3B illustrates a flow chart for calculating ρ using STAGE, according to an embodiment.
Figure 3C:
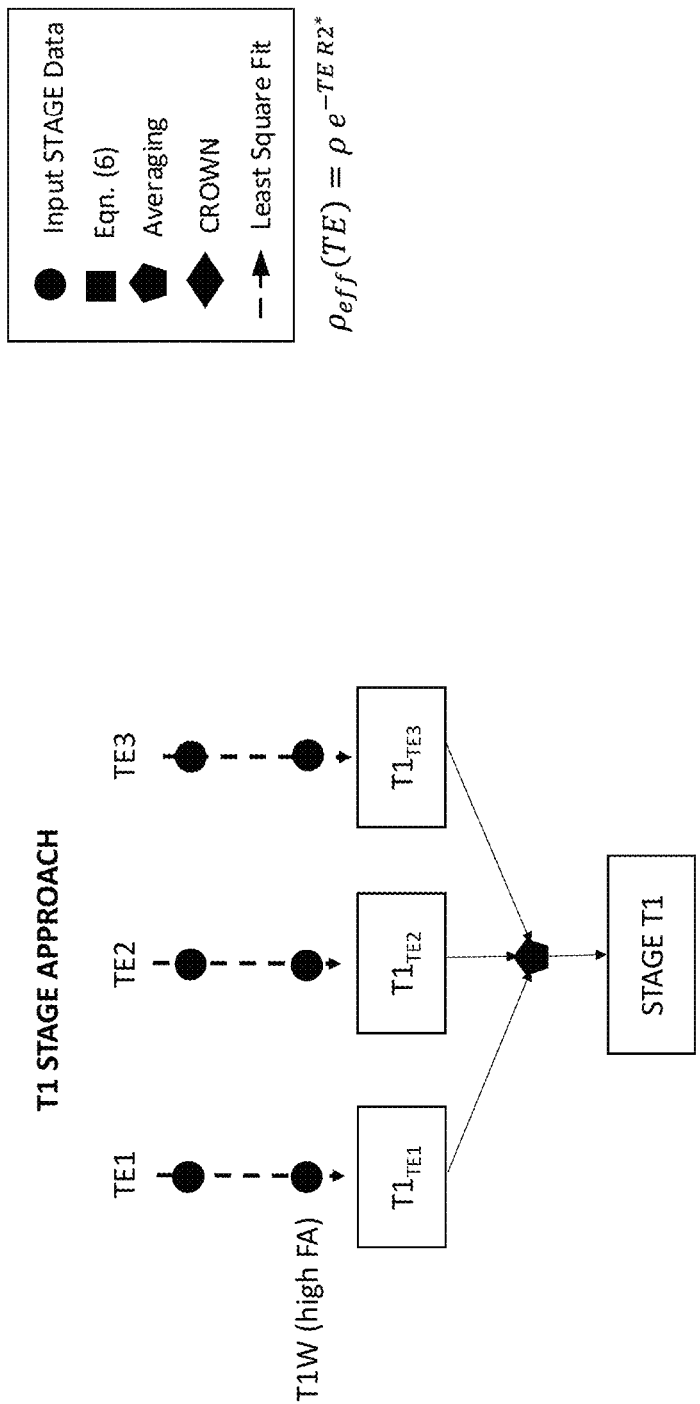
FIG. 3C illustrates a flow chart for calculating T1 using STAGE, according to an embodiment.

In some approaches, STAGE can utilize data from multiple flip angles and echoes to generate maps of PD, T1, and R2*. For M flip angles and N echoes, the total number of datasets used can be M×N. For each of the M flip angles, a least squares fit can be performed over the N echoes to generate a map of R2*. This can result in M R2* maps which can then be averaged together for a final STAGE R2* map. Following that, for each echo, a least squares fit can be performed over the set of M flip angles to generate N T1 maps and effective PD maps (T2* weighted), $\rho_{eff}$. The N T1 maps can be averaged together for a final STAGE T1 map. The STAGE R1 map can be the inverse of this averaged T1 map. Next, each of the N effective PD maps can be corrected using the STAGE R2* map to generate N PD maps (with TE=0 ms). The N PD maps can be averaged together for a final STAGE PD map ($\rho_{AVG}$). These steps are presented as a data flow diagram in FIGS. 3A-3C. FIG. 3A illustrates a flow chart for calculating R2* using STAGE. FIG. 3B illustrates a flow chart for calculating $\rho$ using STAGE. FIG. 3C illustrates a flow chart for calculating T1 using STAGE.

Constrained reconstruction of images with white noise (CROWN) can include a magnetic resonance imaging system. The MRI system can include at least one processor. The MRI system can include a memory, with computer code instructions stored thereon. The computer code instructions, when executed by the at least one processor, can cause the at least one processor to receive an acquired MR dataset. The acquired MR dataset can have a first SNR. The first SNR can include the SNR of the acquired MR dataset.

The processor can extract, from the acquired MR dataset, a first set of values corresponding to a first variable. The first variable can have a second SNR. The second SNR can include the SNR of the first variable. The first variable can include (e.g., correspond to), for example, spin density, $\beta$, susceptibility, or another variable. The first variable can correspond to an inverse of spin density ($1/\beta$). The first variable can correspond to susceptibility. The acquired data can include values that correspond to the first variable. The acquired data can be processed to produce the first variable.

The processor can extract, from the acquired MR dataset, a second set of values corresponding to a second variable. The second variable can include (e.g., correspond to), for example, T1, R1, T2*, or another variable. The second variable can correspond to an inverse of T1. The second variable can correspond to R2*. The second variable can be related (e.g., functionally related) to the first variable. For example, the inverse of T1 can be related to the inverse of spin density via a relationship (e.g., linear relationship). R2* can be related to susceptibility via a relationship (e.g., linear relationship). R2* can be related to the inverse of spin density via a relationship (e.g., linear relationship). The relationship between the two or more variables can be used to derive a constraint function. The acquired data can include values that correspond to the second variable. The acquired data can be processed to produce the second variable.

The processor can apply (e.g., use, establish, identify, implement, execute, etc.) a constraint function (e.g., relationship, linear relationship, relation, etc.). The constraint function can include a function of the first variable and the second variable. The constraint function can be described by Equation 1. The constraint function can include a component that accounts for a presence of iron in a tissue. For example, the relation between two or more variables can account for and be used to correct for the presence of iron. The constraint function can include a component that accounts for each echo time (e.g., TE1, TE2, TE3, etc.).

The computer code instructions can cause the at least one processor to minimize a cost function (e.g., cost) according to the constraint function to generate a cost function solution. The cost function can be described by Equation 2. The cost function solution can include predicted values described by Equation 4 and Equation 5.

The processor can input the first variable and the second variable into the cost function solution to generate a modified first variable having a third SNR. The third SNR can be greater than the second SNR. The third SNR can include the SNR of the modified first variable. The processor can generate a simulated dataset for an arbitrary flip angle (e.g., 0°, 3°, 6°, 9°, 12°, 15°, 18°, 21°, 24°, etc.). For example, the processor can generate, using the modified first variable and the second variable, a simulated dataset for an arbitrary flip angle. One or more images can be created for arbitrary flip angles. Also, one or more images can also be created for any MRI pulse sequence.

The processor can extract, from the acquired MR dataset, a third set of values corresponding to a third variable. The third variable can include, for example, R1* or T2*. The processor can apply (e.g., use) the constraint function. The constraint function can be a function of the first variable, the second variable, and the third variable. The MRI dataset can include more than three variables (e.g., multiple variables). The constraint function can be a function of the multiple variables or a subset of the multiple variables. For the case of a linear relationship between two variables, the constraint function can be described by the equation: y=mx+b. For the case of a linear relationship between multiple variables, the constraint function can be described by the equation: $y=\Sigma_i m_i x_i + b$.

Figure 4:
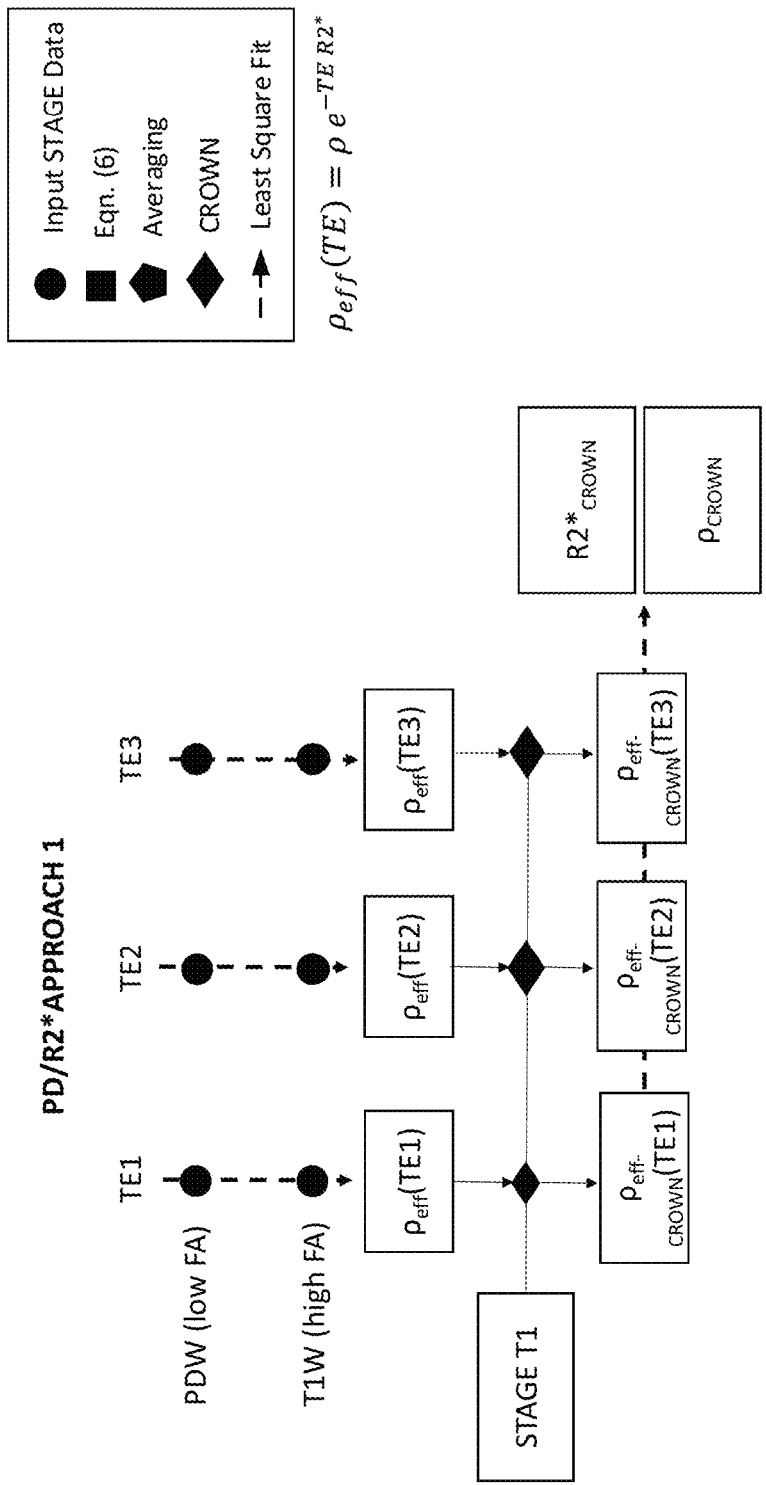
FIG. 4 illustrates a flow chart for calculating $\rho_{CROWN}$ and $R2^*_{CROWN}$ using CROWN processing, according to an embodiment.

Constrained reconstruction of images with white noise (CROWN) can include a variety of approaches. For example, in a first approach (e.g., Approach 1, CROWN Approach 1, etc.), CROWN can be used to improve each effective spin density map, giving $\rho_{\text{eff-CROWN}}$ at each TE. Once CROWN has been used to improve each effective spin density map, the expression $\ln \rho_{\text{eff-CROWN}} = \ln \rho_{\text{CROWN}} - TE\ R2^*_{\text{CROWN}}$ and $R2^*_{\text{CROWN}}$ can be fitted on a pixel-by-pixel basis. This formula can give the slope of the signal as a function of TE as $-R2^*$ and the intercept as $\ln \rho_{\text{CROWN}}$ from which the value of $\rho_{\text{CROWN}}$ and $R2^*_{\text{CROWN}}$ can be obtained. These new images $\rho_{\text{CROWN}}$ and $R2^*_{\text{CROWN}}$ can have higher SNR compared to the SNR of images $\rho$ and $R2^*$. Multiple echo CROWN data can be used to generate $\rho_{\text{CROWN}}$ and $R2^*_{\text{CROWN}}$. The first approach can include the following steps: (1) generate $\rho_{\text{eff-CROWN}}$ for each echo, (2) perform a least squares fit across the logarithm of these data, (3) use the intercept to determine $\rho_{\text{CROWN}}$, and (4) use the slope to determine $R2^*_{\text{CROWN}}$. FIG. 4 illustrates a flow chart for calculating $\rho_{\text{CROWN}}$ and $R2^*_{\text{CROWN}}$ using CROWN processing.

The acquired MR dataset can include data corresponding to a first flip angle and a second flip angle. For example, the first flip angle can include a low flip angle (e.g., an angle less than the Ernst angle). The Ernst angle, $(\theta_E)$, is defined via $\cos(\theta_E) = \exp(-TR/T1)$. The Ernst angle can include the flip angle (e.g., tip angle, nutation angle, etc.) for excitation of a particular spin that gives the maximal signal intensity for any flip angle for a given TR and T1. The second flip angle can include a high flip angle (e.g., an angle greater than the Ernst angle). The acquired MR dataset can be acquired by imaging an anatomical region using at least one echo time (e.g., TE1, TE2, TE3, etc.).

In a second approach (e.g., Approach 2, CROWN Approach 2, etc.), $R2^*$ can be determined from fitting the original multi-echo STAGE data or from Approach 1 using CROWN processing. Once $R2^*$ is determined, the effective spin density from each echo can be corrected to produce a $\rho$ map with no $R2^*$ weighting, by rearranging Equation 6, $\rho = \rho_{\text{eff}}/e^{-TE\ R2^*}$. With the use of CROWN $R2^*$, each of these $\rho$ maps can be quite noisy but with CROWN processing the SNR can be dramatically improved. One implementation of this is to use the coefficients of 2.03/sec and −1.81/sec for a and b, respectively, and then averaging the resulting images for a final CROWN $\rho$ map, $\rho_{\text{AVG-CROWN}}$. This can provide an alternative to Approach 1 to generate $\rho_{\text{CROWN}}$.

To further generate an improved $R2^*$ map, the log of the ratio of the original effective spin density maps from STAGE with the averaged zero echo time spin density can be taken to give $\ln [\rho_{\text{eff}}/\rho_{\text{AVG-CROWN}}] = -TE\ R2^*$. Since TE is known, an $R2^*$ map can be calculated from each echo and then, again, averaged for a final $R2^*_{\text{CROWN}}$ map.

Figure 5:
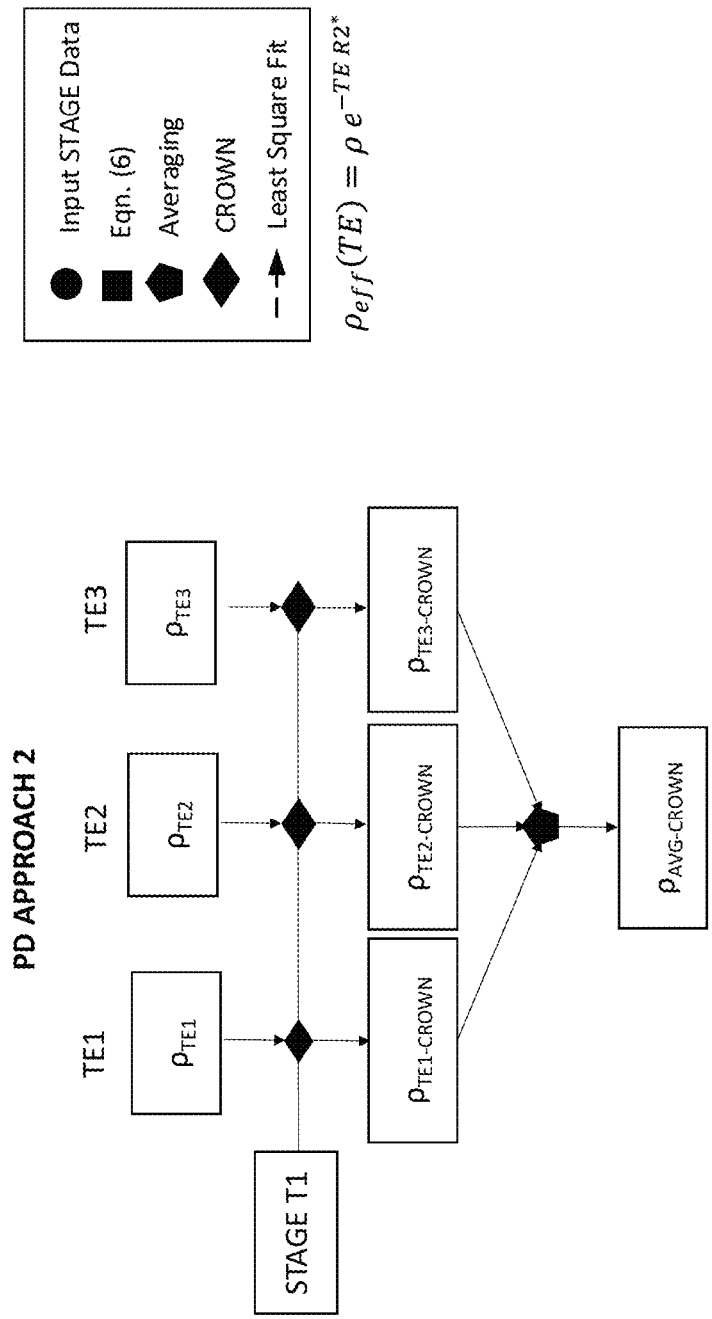
FIG. 5 illustrates a flow chart for calculating $\rho_{AVG\text{-}CROWN}$ using CROWN processing, according to an embodiment.
Figure 6:
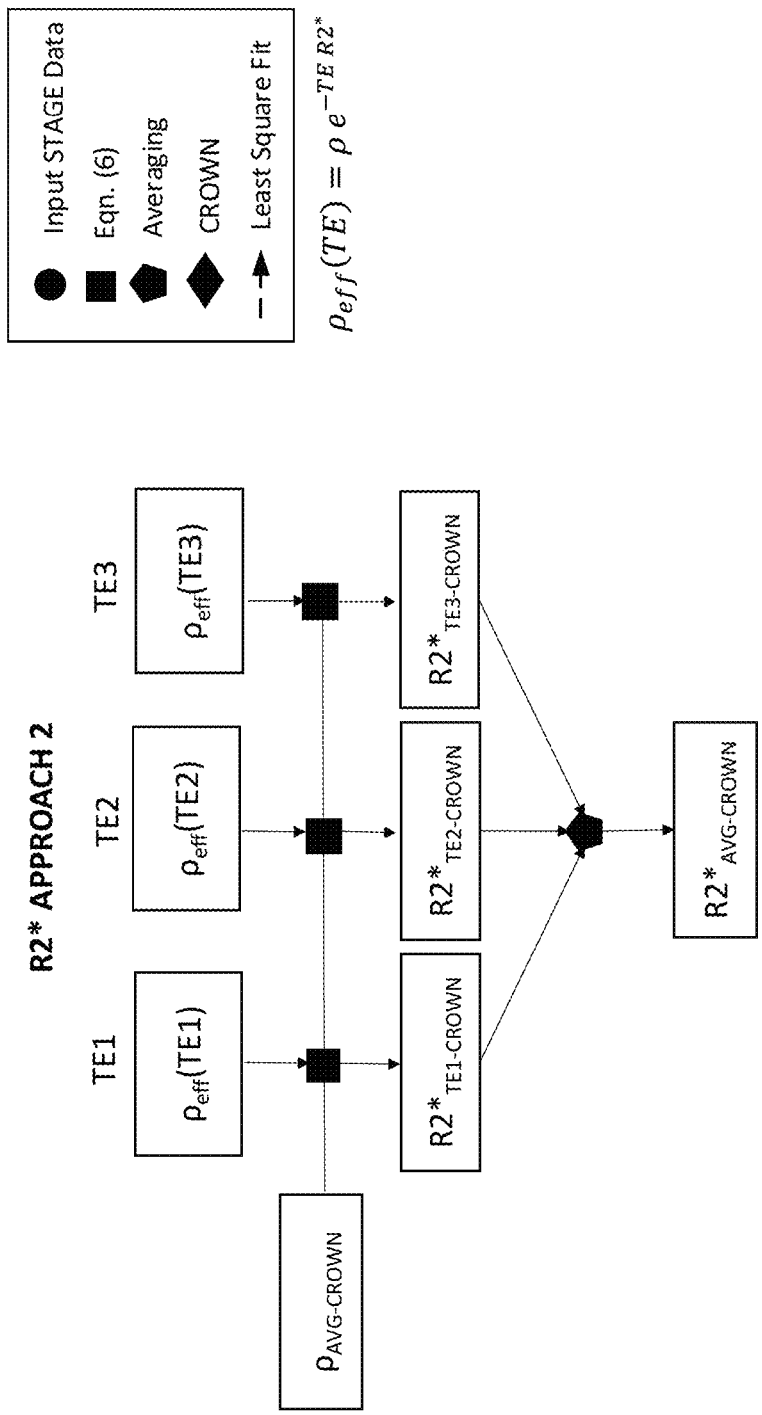
FIG. 6 illustrates a flow chart for calculating $R2^*_{AVG\text{-}CROWN}$ using CROWN processing, according to an embodiment.

The second approach can include the following steps: (1) generate $\rho_{\text{eff}}$ for each echo using the conventional STAGE approach, (2) generate STAGE $R2^*$ using the conventional STAGE approach, (3) use Equation 6 with $\rho_{\text{eff}}$ and STAGE $R2^*$ to determine $\rho$ for each echo (e.g., $\rho_{TE1}$, $\rho_{TE2}$, etc.), (4) apply CROWN to each $\rho$ to obtain $\rho_{\text{CROWN}}$ for each echo (e.g., $\rho_{TE1\text{-CROWN}}$, $\rho_{TE2\text{-CROWN}}$, etc.), (5) average these together to obtain AVG-CROWN, (6) use Equation 6 with $\rho_{\text{eff}}$ and $\rho_{\text{AVG-CROWN}}$ to determine a new $R2^*$ for each echo, (7) average these together to obtain a final $R2^*_{\text{CROWN}}$. FIG. 5 illustrates a flow chart for calculating $\rho_{\text{AVG-CROWN}}$ using CROWN processing. FIG. 6 illustrates a flow chart for calculating $R2^*_{\text{AVG-CROWN}}$ using CROWN processing.

In the second approach, the acquired MR dataset can include data corresponding to a first flip angle and a second flip angle. The acquired MR dataset can be acquired by imaging an anatomical region using at least one echo time (e.g., TE1, TE2, TE3, etc.). The processor can generate a first calculated value of a third variable. The third variable can correspond to $R2^*$. The third variable can have a fourth SNR. The processor can generate, using the modified first variable, a second calculated value of a modified third variable. The modified third variable can include $R^{2*}_{\text{CROWN}}$. The modified third variable can have a fifth SNR. The fifth SNR can be greater than the fourth SNR.

In some embodiments, the acquired MR dataset can include data corresponding to a first flip angle and a second flip angle for a plurality of echo times. The processor can generate a weighted average value for at least one of the first variable and the modified first variable over the plurality of echo times. For example, the processor can generate a weighted average of spin density (e.g., $\rho_{\text{AVG-CROWN}}$) or $R2^*$ (e.g., $R^{2*}_{\text{CROWN}}$).

Figure 7:
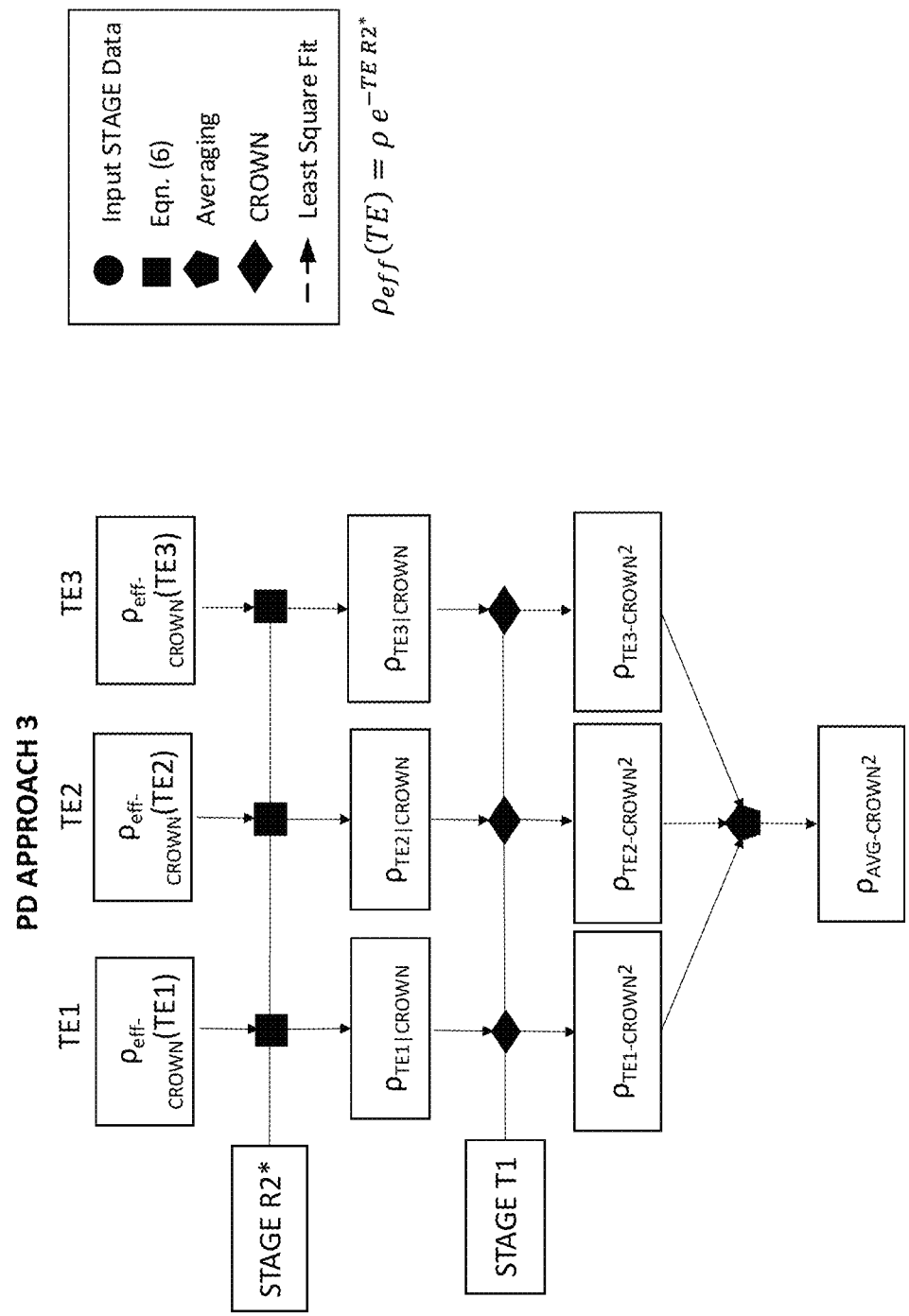
FIG. 7 illustrates a flow chart for calculating $\rho_{AVG\text{-}CROWN^2}$ using CROWN processing, according to an embodiment.

A third approach (e.g., Approach 3, CROWN Approach 3, etc.) can be similar to the second approach, except for starting with $\rho_{\text{eff-CROWN}}$ rather than $\rho_{\text{eff}}$ to improve PD and $R2^*$ (e.g., using $\rho_{\text{eff-CROWN}}/e^{-TE\ R2^*}$ to obtain $\rho_{\text{AVG-CROWN}}$ and then $\ln[\rho_{\text{eff-CROWN}}/\rho_{\text{AVG-CROWN}}]$ to obtain $R^{2*}_{\text{CROWN}}$). The third approach can include the following steps: (1) generate $\rho_{\text{eff-CROWN}}$ for each echo, (2) generate STAGE $R2^*$ using the conventional STAGE approach, (3) use Equation 6 with $\rho_{\text{eff-CROWN}}$ and STAGE $R2^*$ to determine a $\rho_{\text{CROWN}}$ for each echo (e.g., $\rho_{TE1|\text{CROWN}}$, $\rho_{TE2|\text{CROWN}}$, etc.), (4) apply CROWN again to each $\rho_{\text{CROWN}}$ to obtain $\rho_{\text{CROWN}}^2$ for each echo (e.g., $\rho_{TE1\text{-CROWN}}^2$, $\rho_{TE2\text{-CROWN}}^2$, etc.), (5) average these together to obtain $\rho_{\text{AVG-CROWN}}^2$, (6) use Equation 6 with $\rho_{\text{eff-CROWN}}$ and $\rho_{\text{AVG-CROWN}}^2$ to determine a new $R2^*$ for each echo, (7) average these together to obtain a final $R2^*_{\text{CROWN}}{}^2$. FIG. 7 illustrates a flow chart for calculating $\rho_{\text{AVG-CROWN}}^2$ using CROWN processing. FIG. 8 illustrates a flow chart for calculating $R^{2*}_{\text{AVG-CROWN}}{}^2$ using CROWN processing.

In some embodiments of the third approach, the acquired MR dataset can include data corresponding to a first flip angle and a second flip angle. The acquired MR dataset can be acquired by imaging an anatomical region using at least one echo time (e.g., TE1, TE2, TE3, etc.). The modified first variable can include a first modified first variable. The first modified first variable can include effective spin density (e.g., $\rho_{\text{eff}}$). The processor can generate a first calculated value of a third variable. The third variable can correspond to $R2^*$. The third variable can have a fourth SNR. The processor can use the first modified first variable at each of the at least two echo times and the third variable to generate a second modified first variable (e.g., $\rho_{TE1|\text{CROWN}}$, $\rho_{TE2|\text{CROWN}}$, $\rho_{TE3|\text{CROWN}}$, etc.). The processor can use (e.g., apply) the second modified first variable at each of the at least two echo times and the second variable as inputs into the cost function solution to generate a third modified first variable (e.g., $\rho_{TE1\text{-}CROWN}^2$, $\rho_{TE2\text{-}CROWN}^2$, $\rho_{TE3\text{-}CROWN}^2$, etc.) having a sixth SNR. The sixth SNR can be greater than the third SNR.

In some embodiments of the third approach, the processor can generate a second calculated value of the third variable (e.g., $R2^*_{TE1\text{-}CROWN}{}^2$, $R2^*_{TE2\text{-}CROwN}{}^2$, $R2^*_{TE3\text{-}CROWN}{}^2$, etc.). The third variable can correspond to $R2^*$. The third variable can have a seventh SNR. The seventh SNR can be greater than the fourth SNR.

In some embodiments, the acquired MR dataset can include data corresponding to a first flip angle and a second flip angle for a plurality of echo times. The processor can generate a weighted average value for at least one of the first variable and the modified first variable over the plurality of echo times. For example, the processor can generate a weighted average of spin density (e.g., $\rho_{AVG\text{-}CROWN}^2$) or $R2^*$ (e.g., $R2^*_{AVG\text{-}CROWN}{}^2$). In some embodiments, the processor can generate a spin density image (e.g., TE=0, true spin density image, etc.).

Some slightly different notation can be used for some of the intermediate steps in Approach 3 compared to Approach 2. Since in Approach 3, CROWN is applied prior to correcting for $R2^*$ (to generate $\rho_{\textit{eff-CROWN}}$), these $\rho$ maps after $R2^*$ correction can be called $\rho_{TEi|CROWN}$. Then, after CROWN is applied a second time, the notation $_{CROWN}{}^2$ can be used. A table of terms with descriptions is shown in Table 3.

further within it to generate the final $\rho_{AVG\text{-}CROWN}$ and $R2^*$ AVG-CROWN.

The processor can generate a simulated MR dataset having an eighth SNR. The eighth SNR can be greater than the first SNR. The processor can generate a simulated MR dataset by using the modified first variable. The simulated MR dataset can have a greater SNR than the SNR of the acquired dataset.

In some embodiments, the acquired MR dataset includes a first set of echo times. The processor can generate a simulated MR dataset. The simulated MR dataset can include a second set of echo times. The second set of echo times can be different from the first set of echo times. The processor can generate the simulated MR dataset by using the modified first variable and the second variable and a modified third variable.

FIGS. 9A-9E illustrate $\rho_{\textit{eff}}$ maps and $\rho$ maps depicted in FIGS. 3A-3C and FIGS. 4-8. The $\rho_{\textit{eff}}$ maps and $\rho$ maps can correspond to a single echo with an echo time of 7.5 ms. FIG. 9A depicts $\rho_{\textit{eff}}(TE1)$ before any CROWN is performed and corresponds to FIG. 3B. FIG. 9C depicts $\rho_{TE1}$ before any CROWN is performed and corresponds to FIG. 5. FIG. 9B depicts $\rho_{\textit{eff-CROWN}}(TE1)$ and how it is used can be seen in FIGS. 4, 7, and 8. FIG. 9D depicts $\rho_{TE1\text{-}CROWN}$, which can be the result of CROWN being performed on $\rho_{TE1}$ of FIG. 9C. The contrast of the substantia nigra (SN) and red nucleus (RN) can appear to increase after CROWN, which could be due to not correcting the R1 map for iron. FIG. 9E depicts

| Term | Explanation | Approaches Used | Approach Generated |
|---|---|---|---|
| $\rho_{\textit{eff}}(TE_i)$ | The effective ($R2^*$ weighted) PD map generated by conventional STAGE for a single echo time, $TE_i$. Defined in Equation 6. | 1, 2 | STAGE |
| $\rho_{\textit{eff-CROWN}}(TE_i)$ | The result of applying CROWN to $\rho_{\textit{eff}}(TEi)$ | 1, 3 | 1 |
| $\rho$ | The general term for a "true" PD map with no $R2^*$ weighting. Can also be thought of as $\rho_{\textit{eff}}(TE = 0)$ | N/A | N/A |
| $\rho_{TEi}$ | The result of correcting $\rho_{\textit{eff}}(TE_i)$ for $R2^*$, specifically at $TE_i$. Can also be viewed as $\rho_{\textit{eff}}(TE = 0)$ | 2 | STAGE |
| $\rho_{AVG}$ | The $\rho$ map generated by averaging $\rho_{TEi}$ over all possible echoes. This is the conventional STAGE way to generate a "true" PD map. | N/A | STAGE |
| $\rho_{CROWN}$ | The intercept result of performing a least squares fit across all available $\rho_{\textit{eff-CROWN}}(TE_i)$ | N/A | 1 |
| $\rho_{TEi\text{-}CROWN}$ | The result of applying CROWN to $\rho_{TEi}$ | 2 | 2 |
| $\rho_{TEi|CROWN}$ | The result of correcting $\rho_{\textit{eff-CROWN}}(TE_i)$ for $R2^*$, specifically at $TE_i$ | 3 | 3 |
| $\rho_{AVG\text{-}CROWN}$ | The result of averaging together all available $\rho_{TEi\text{-}CROWN}$ | N/A | 2 |
| $\rho_{TEi\text{-}CROWN}{}^2$ | The result of applying CROWN to $\rho_{TEi|CROWN}$ | 3 | 3 |
| $\rho_{AVG\text{-}CROWN}{}^2$ | The result averaging together all available $\rho_{TEi\text{-}CROWN}{}^2$ | N/A | 3 |
| $R2^*_{CROWN}$ | The slope result of performing a least squares fit across all available $\rho_{\textit{eff-CROWN}}(TEi)$ | N/A | 1 |
| $R2^*_{TEi\text{-}CROWN}$ | The $R2^*$ map generated from $\rho_{\textit{eff}}(TE_i)$ and $\rho_{AVG\text{-}CROWN}$ | 2 | 2 |
| $R2^*_{TEi\text{-}CROWN}{}^2$ | The $R2^*$ map generated from $\rho_{\textit{eff-CROWN}}(TE_i)$ and $\rho_{AVG\text{-}CROWN}{}^2$ | 3 | 3 |
| $R2^*_{AVG\text{-}CROWN}$ | The result of averaging together all available $R2^*_{TEi\text{-}CROWN}$ | N/A | 2 |
| $R2^*_{AVG\text{-}CROWN}{}^2$ | The result of averaging together all available $R2^*_{TEi\text{-}CROWN}{}^2$ | N/A | 3 |
| STAGE $R2^*$ | The average of all $R2^*$ maps generated for each flip angle collected for STAGE (by fitting over echo time) | 2, 3 | STAGE |
| STAGE T1 | The average of all T1 maps generated for each echo time collected for STAGE (by fitting over flip angle) | 1, 2, 3 | STAGE |

Table 3 illustrates a description of the different terms used in FIGS. 3A-3C and FIGS. 4-8 described in the present disclosure. Table 3 illustrates which approach the terms are used in and/or generated from. For example, $\rho_{AVG}$ can be generated in the conventional STAGE approach, but not used in any of Approaches 1-3. On the other hand, $\rho_{TE1\text{-}CROWN}$ can be generated in Approach 2, and used $\rho_{TE1\text{-}CROWN}{}^2$ from FIG. 7 and is the result of correcting $\rho_{\textit{eff-CROWN}}(TE1)$ for $R2^*$ and then applying CROWN a second time.

New images can be generated from the CROWN PD and T1 maps. The CROWN images can also be used to simulate images with the original flip angles and create higher quality images than were originally collected. For given tissue parameters T1, ρ, and T2*, together with imaging parameters TR, TE, and flip angle θ, the predicted signal from a spoiled GRE scan, S, is given as Equation 11:

$$S(\theta) = \rho \cdot e^{-TE/T2^*} \sin(\theta) \frac{\left(1 - e^{-\frac{TR}{T1}}\right)}{\left(1 - e^{-\frac{TR}{T1}} \cos(\theta)\right)} \quad (11)$$

These CROWN processed maps can be input into Equation 11 to regenerate the spoiled GRE datasets which were used to create them. The SNR of the results can be compared with the original images. Further, any scan that has well mathematically understood signal behavior as a function of T1, PD, and T2* can be simulated with any imaging parameters. This can provide better SNR than what would have been acquired using the actual sequence, making CROWN processing a powerful tool to improve the SNR even for the originally collected data.

Figure 10:
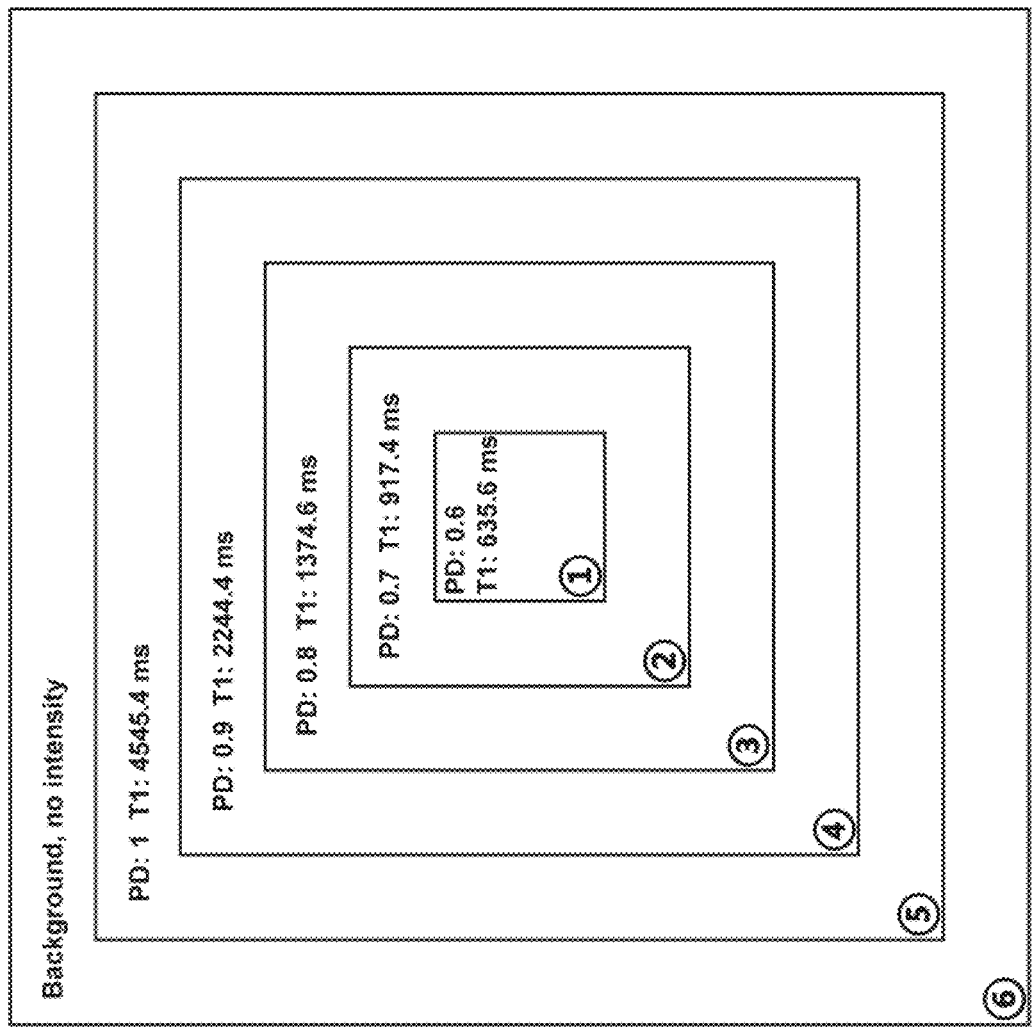
FIG. 10 illustrates a test image used in the simulations, according to an embodiment.

FIG. 10 illustrates a test image used in the simulations. Five different tissue types can be used in the simulations. Each annular region can represent one tissue type. A background square with no intensity can be added as the outer region. The test image can be built out of a set of embedded squares with each annular-like region representing one tissue type. First, the original signal intensity can be calculated using Equation 11. Five types of tissues with spin density values ranging from 0.6, 0.7, 0.8, 0.9 and 1 can be used in the simulations and the corresponding T1 values can be calculated using R1=2.03/sec*β−1.81/sec. A TR of 25 ms and TE of 0 ms can be used to generate both 6° and 24° data. The outer border region can be set to have zero signal intensity. Final values for 6° and 24° magnitude images are given in Table 4.

|  | Region 1 | Region 2 | Region 3 | Region 4 | Region 5 |
| --- | --- | --- | --- | --- | --- |
| 6° magnitude | 55.18 | 61.06 | 64.4 | 63.18 | 52.44 |
| 24° magnitude | 77.35 | 68.94 | 56.98 | 41.99 | 24.39 |
| PD map | 600 | 700 | 800 | 900 | 1000 |
| T1 map | 635.59 | 917.43 | 1374.57 | 2244.4 | 4545.45 |

Table 4 illustrates the initial signals used in the simulation of the MRI magnitude for regions 1 to 5 to generate the conventional and CROWN PD and T1 maps.

Figure 11:
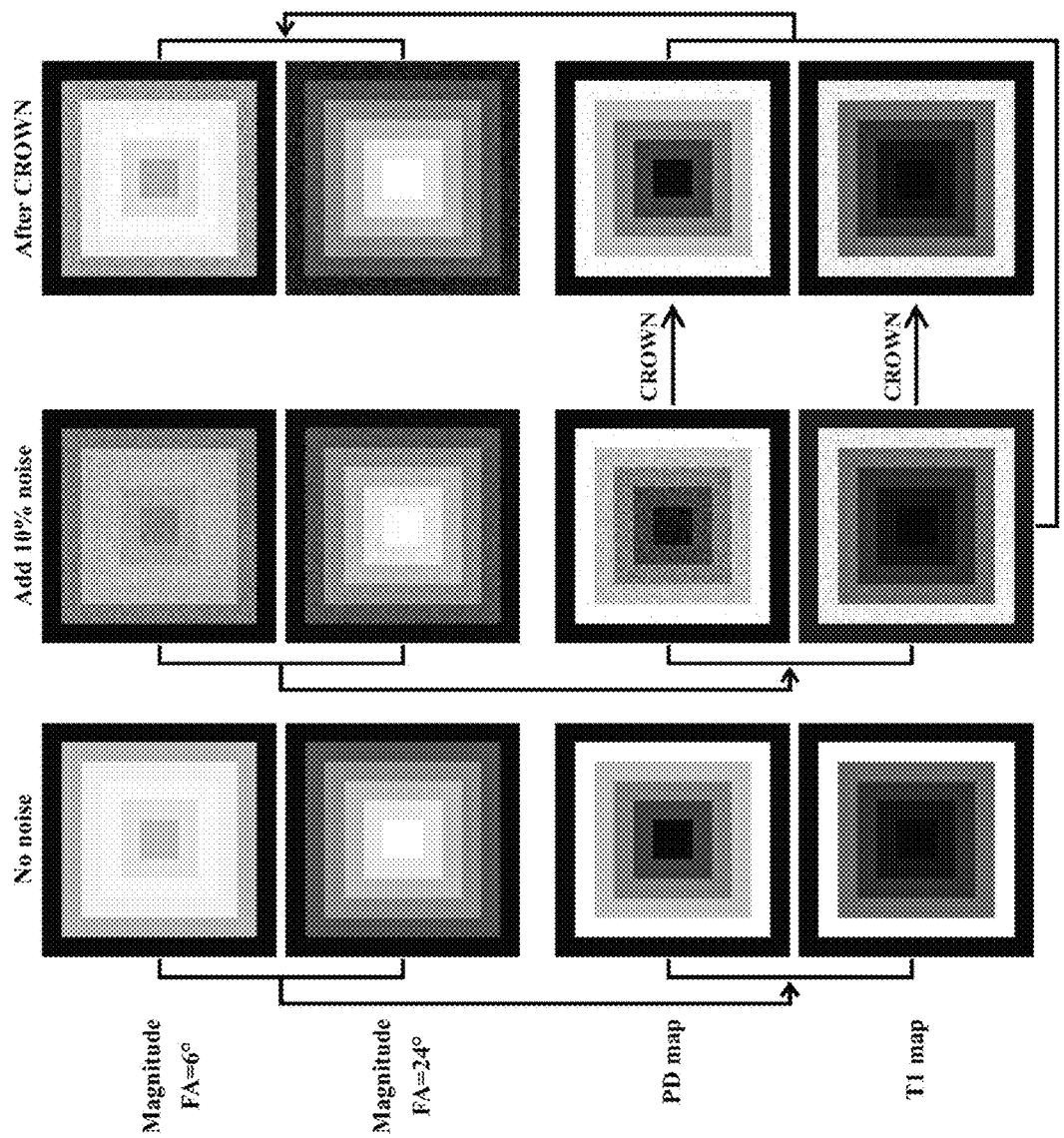
FIG. 11 illustrates simulation results for CROWN processing, according to an embodiment.

As a demonstrative case, Gaussian noise can then be added to the original signal. The amount of noise can be set to be 10% of the signal from region 1 at the 6° magnitude image. Second, the PD and T1 maps can be generated based on the linear transformation of Equation 11. Finally, CROWN can be applied on the PD and T1 maps to remove the noise. 6° and 240 magnitude images can be reproduced to compare the results with the original data. FIG. 11 illustrates simulation results for CROWN processing. To simulate a more realistic situation, 10% Gaussian noise (e.g., relative to the signal of the center square for the 6° magnitude image) can be added to each image. PD and T1 maps can be generated using 6° and 24° magnitude images, then the CROWN process can be applied on both maps. CROWN processed PD maps and original T1 maps can be used to reproduce 6° and 24° magnitude images.

For an imaging approach, two sets of STAGE data can be collected from two different individuals on two different MRI scanners. The first set of STAGE data can be collected on a 3T Siemens Prisma scanner with a 64-channel head/neck coil using the following imaging parameters: a resolution of 0.67 mm×1 mm×1.34 mm; FOV=256 mm×192 mm (final matrix 384×288); TE1=7.5 ms, TE2=15 ms, and TE3=22.5 ms; TR=29 ms; bandwidth=180 Hz/pixel; FA=6° and 27°; PFP=7/8; using elliptical sampling; axial imaging plane; and a parallel acceleration factor=3. The total imaging time can be 6 minutes 42 seconds.

The second set of STAGE data can be collected on a 3T Siemens Skyra with a 16-channel head/neck coil using the following imaging parameters: a resolution of 0.67 mm×1 mm×1.34 mm; FOV=256 mm×192 mm (final matrix 384×288); TE1=7.5 ms, TE2=12.5 ms, and TE3=17.5 ms; TR=25 ms; bandwidth=220 Hz/pixel; FA=6° and 24°; partial Fourier factor=7/8; using elliptical sampling; and a parallel acceleration factor=2. The total imaging time can be 8 minutes 30 seconds. After acquisition, the STAGE data can be processed to generate T1 and effective spin density maps, both corrected for B1 transmit/receive inhomogeneity.

Figure 12:
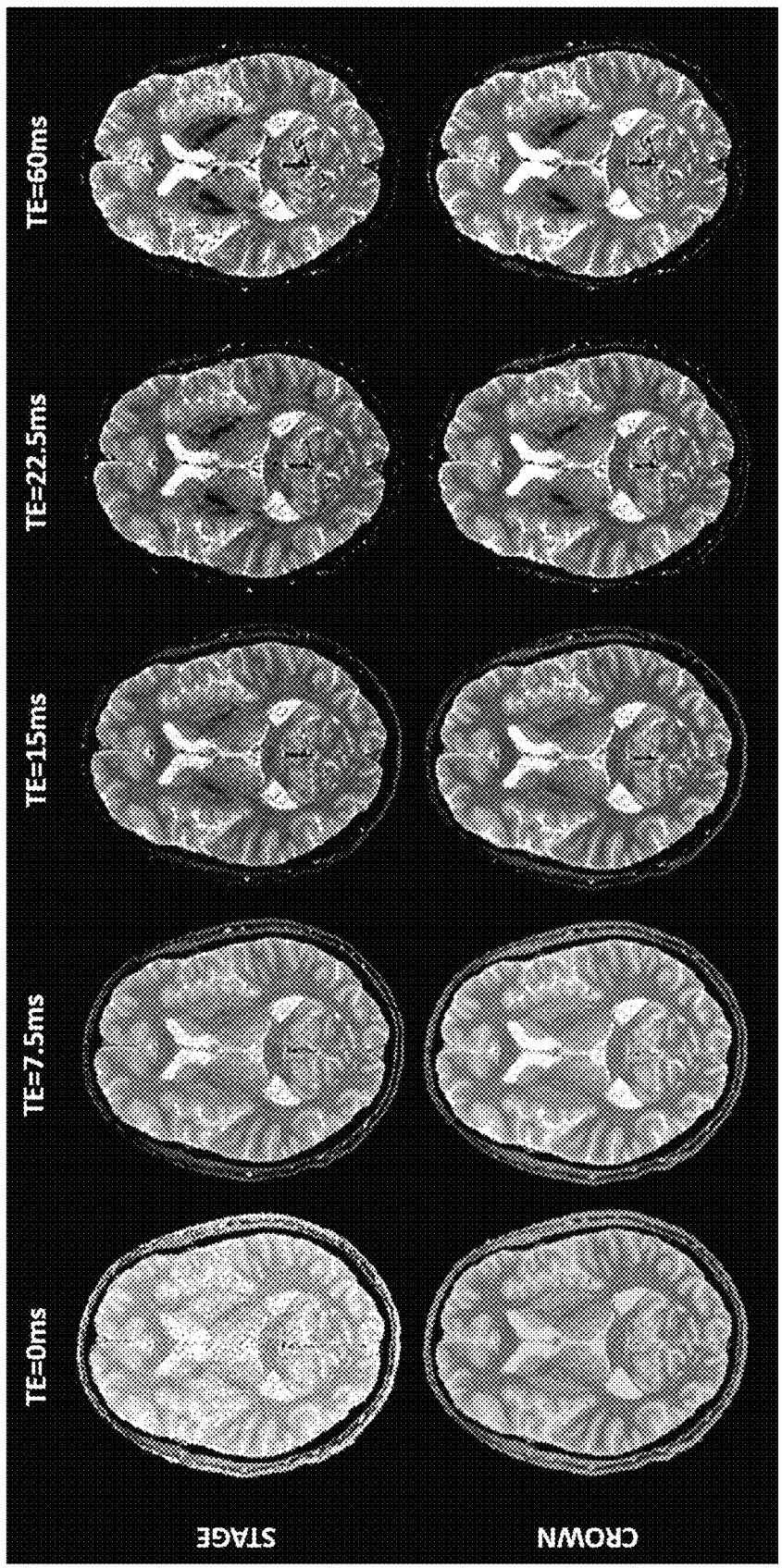
FIG. 12 illustrates an example of CROWN processing performed on multiple STAGE PD maps, according to an embodiment.

FIG. 12 illustrates an example of CROWN processing performed on multiple STAGE PD maps. The STAGE PD maps can be created from the 3T Siemens Prisma STAGE data. The echo time of zero (TE=0 ms) for the STAGE row (e.g., top row) can be determined from the intercept of a linear fit across the three effective STAGE PD maps (e.g., similar to Approach 1 except using $\rho_{eff}$ rather than $\rho_{eff-CROWN}$). The CROWN coefficients used can be from Table 2. The CROWN row (e.g., bottom row) is shown. The most dramatic effect of noise reduction can be seen at an echo time of zero (TE=0 ms) where the initial estimate is the noisiest. The TE=60 ms PD map can be simulated using both the R2* map and the $\rho_{AVG}$ map (e.g., both CROWN and STAGE versions) to show how long echo times can be generated to create unique T2* contrast.

Figure 13:
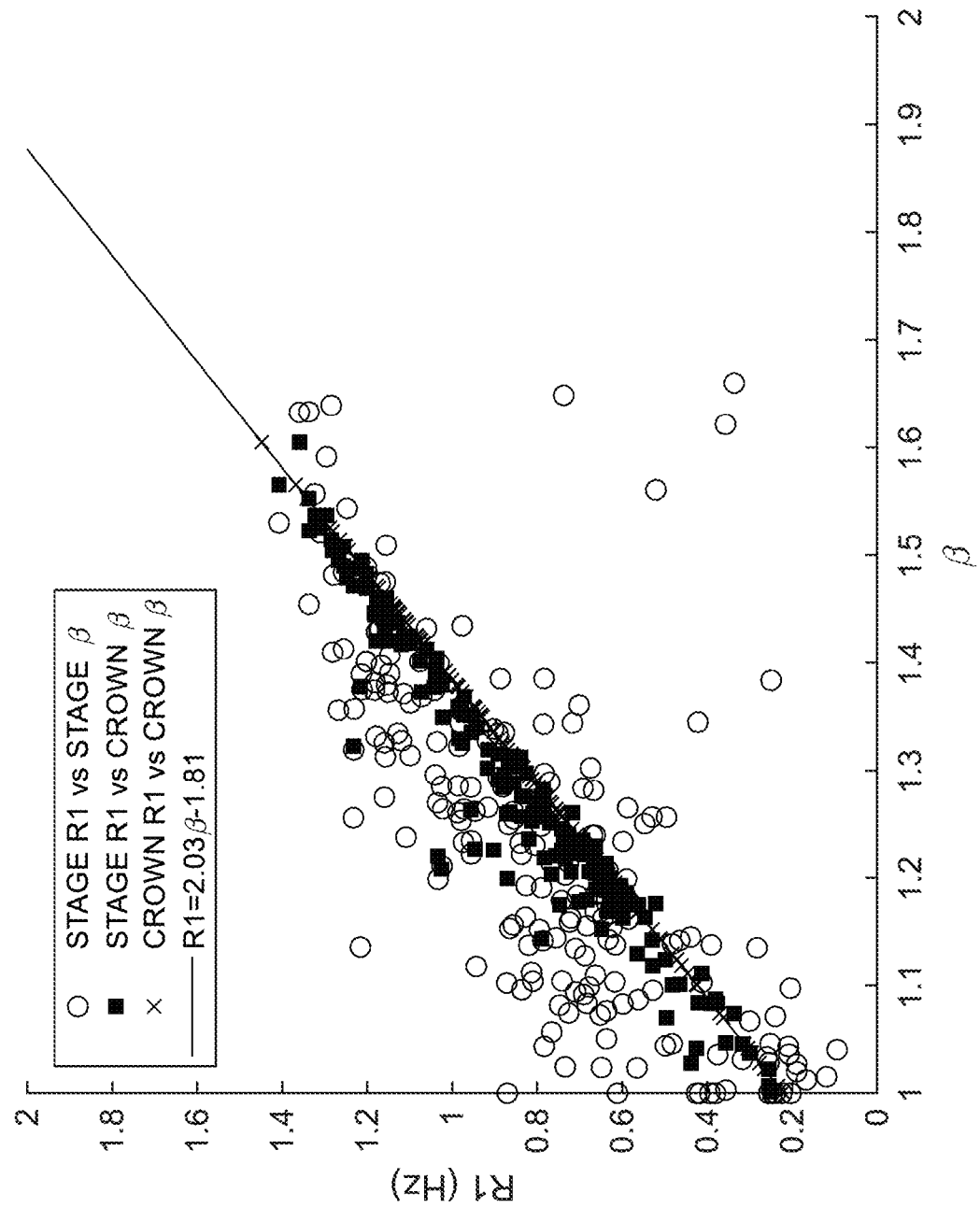
FIG. 13 illustrates a scatter plot of R1 values versus β values for different combinations of STAGE and CROWN processed maps, according to an embodiment.

FIG. 13 illustrates a scatter plot of R1 values versus β values for different combinations of STAGE and CROWN processed maps using the pixels from the same slice shown in FIG. 12 (at TE=0 ms). The effect of CROWN processing can be seen in steps, from the noisy distribution of points before CROWN (STAGE R1 vs STAGE β), to the tighter distribution seen from applying CROWN to just the R values first using Equation 4 (STAGE R1 vs CROWN β), and finally to the perfectly linear distribution seen from re-calculating R1 from the CROWN R values using Equation 5 (CROWN R1 vs CROWN β).

FIGS. 14A-14H illustrate the efficacy of CROWN processing for forward simulating data using 3T Siemens Skyra STAGE data. The CROWN simulated images can be generated using STAGE T1, $\rho_{AVG-CROWN}$, and $R2^*_{AVG-CROWN}$ as inputs into Equation 11. The original data from the Skyra can be seen in FIGS. 14A, 14C, 14E, and 14G with their corresponding forward simulated data from CROWN in FIGS. 14B, 14D, 14F, and 14H, respectively. FIGS. 14A, 14B, 14C, and 14D show the 6° STAGE data and FIGS. 14E, 14F, 14G, and 14H show the 24° STAGE data. FIGS. 14A, 14B, 14E, and 14F is from TE=7.5 ms and FIGS. 14C, 14D, 14G, and 14H is from TE=22.5 ms. The low flip angle (FA=6°) images can be quite noisy and can suffer from receive field inhomogeneity, as shown in FIGS. 14A and 14C while the CROWN/STAGE simulated FA=6° image has significantly improved SNR and uniformity, as shown in FIGS. 14B and 14D.

FIG. 14A illustrates a spin density weighted image with a short echo time (TE) before (e.g., prior to) CROWN processing. FIG. 14B illustrates a spin density weighted image with a short echo time after (e.g., post) CROWN processing of the data used to generate FIG. 14A. FIGS. 14A and 14B depict a region (e.g., same region) encompassed by a dashed circle. FIG. 14B depicts a CROWN simulated image showing an inhomogeneity (e.g., tumor) that is distinguishable (e.g., visually distinguishable, distinct) from the surrounding tissue. In this image, the inhomogeneity can be distinguishable from the surrounding tissue because the CROWN processed image has a higher signal-to-noise ratio than the image before CROWN processing (e.g., STAGE image, pre-processed image). FIG. 14A depicts the corresponding region encompassed by the dashed circle. In this image, the inhomogeneity may not be clearly distinguishable from the surrounding tissue because the image has a lower signal-to-noise ratio than that of FIG. 14B.

FIG. 14C illustrates a spin density weighted image with a long echo time (e.g., long compared to the echo time of the image shown in FIGS. 14A and 14B) before CROWN processing. FIG. 14D illustrates a spin density weighted image with a long echo time after CROWN processing of the data used to generate FIG. 14C. FIG. 14E illustrates a T1 weighted image with a short echo time before CROWN processing. FIG. 14F illustrates a T1 weighted image with a short echo time after CROWN processing of the data used to generate FIG. 14E. FIG. 14G illustrates a T1 weighted image with a long echo time (e.g., long compared to the echo time of the image shown in FIGS. 14E and 14F) before CROWN processing. FIG. 14H illustrates a T1 weighted image with a long echo time after CROWN processing of the data used to generate FIG. 14G.

The MRI system can include a third set of values corresponding to the acquired MR dataset at a set of positions. The set of positions can correspond to a map (e.g., spin density map). A subset of the third set of values can satisfy a predetermined threshold. For example, the subset of the third set of values can be greater than a predetermined threshold or less than a predetermined threshold. The subset of the third set of values can include a subset of the set of positions. The subset of the set of positions can correspond to a location of blood vessels. The MRI system can include a simulated MR dataset. The simulated MR dataset can include a fourth set of values at the subset of the set of positions. The fourth set of values can include values at the location of blood vessels. The subset of the set of positions can include the location of blood vessels. The processor can replace the fourth set of values at the set of positions with the subset of the third set of values at the set of positions. For example, the processor can overlay the image of blood vessels from an original spin density map onto an improved spin density map. The improved spin density map can have a greater SNR than the SNR of the original spin density map.

Figure 15:
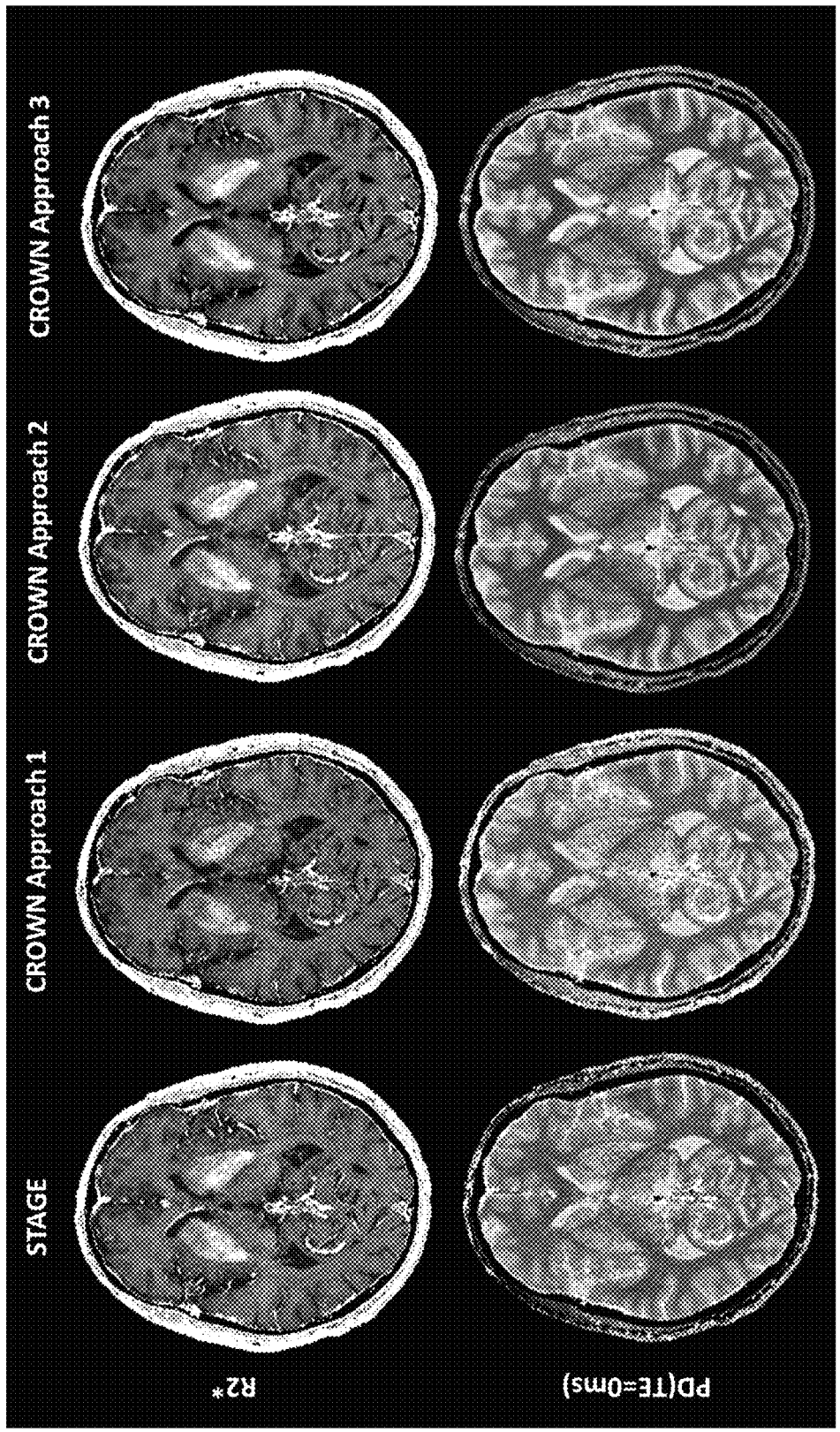
FIG. 15 illustrates examples of different methods of generating ρ and R2* maps, according to an embodiment.

FIG. 15 illustrates examples of different methods of generating ρ and R2* maps from the Prisma dataset. Using the notations depicted in Table 3 and FIGS. 3A-3C and FIGS. 4-8, from left to right, the top row depicts STAGE R2*, R2*$_{CROWN}$, R2*$_{AVG-CROWN}$, and R2*$_{AVG-CROWN}^2$. The bottom row depicts ρ$_{AVG}$, ρ$_{CROWN}$, ρ$_{AVG-CROWN}$, and ρ$_{AVG-CROWN}^2$. Approaches 2 and 3 can work well for ρ. Approach 3 can work well for R2*.

The efficacy of CROWN processing can be demonstrated in FIGS. 10 and 11 for the simulation results and FIGS. 12, 13, 14A-14H, and 15 for the in vivo results where the original noisy spin density maps, R2* maps, and low flip angle images can be seen to have significantly improved.

The values of (β, R1) from region 1 in the simulation can be plotted to compare the change of β and R1 before and after CROWN, as shown in FIG. 2. The range of R can be reduced from [1.25, 2.2] to [1.5, 1.82], which can imply that the noise in the spin density map should decrease, and the SNR of the spin density map, therefore, should increase. However, the range of R1 can increase from [1.4, 1.8] to [1.25, 2.0], which can imply that the noise in the T1 map does not decrease, and the SNR of the T1 map may not improve after the CROWN processing. This same effect can be seen on the in vivo data, as shown in FIG. 13. These predictions can be verified in the simulations shown in Table 5, where it can be seen that the SNR of the spin density map for each region can increase after the CROWN processing. However, the SNR of the T1 map for regions 1, 2, and 3 can decrease after CROWN. With this effect in mind, the original T1 map can be used instead of the CROWN processed T1 map to reproduce the new CROWN 6° (FIG. 14D) and 24° magnitude images.

|  |  | Region 1 | Region 2 | Region 3 | Region 4 | Region 5 |
|---|---|---|---|---|---|---|
| Before | 6° magnitude | 10.00 | 11.05 | 11.57 | 11.43 | 9.49 |
| CROWN | 24° magnitude | 13.99 | 12.47 | 10.23 | 7.6 | 4.42 |
| (10% noise) | PD map | 9.41 | 10.71 | 12.18 | 16.55 | 0.45 |
|  | T1 map | 19.59 | 56.75 | 51.05 | 11.4 | 0.21 |
| After | 6° magnitude | 29.38 | 47.79 | 60.46 | 37.2 | 9.6 |
| CROWN | 24° magnitude | 201.29 | 95.95 | 35.5 | 13.86 | 5.28 |
|  | PD map | 24.77 | 41.87 | 83.63 | 517.73 | 18.49 |
|  | T1 map | 11.73 | 15.96 | 24.28 | 97.85 | 5.3 |

Table 5 illustrates SNR values for the simulated data before and after CROWN processing. Gaussian noise of 10% of the signal from region 1 for the 6° magnitude image can be used for all regions in the 6° and 240 generated magnitude images.

As shown in FIG. 11, the noise can be significantly reduced after CROWN processing for the spin density map. The SNR can be significantly improved for all regions but with dramatic improvements in regions 4 and 5 of Table 5. The noise can be significantly reduced for the 6° and 240 magnitude images after CROWN, especially for regions 1 to 4 of Table 5. The SNR for region 5 that represents CSF may not improve significantly. This may be a result of the low SNR for region 5 from the original T1 map and the fact that 6° is not below the Ernst angle for CSF. Had a flip angle dataset lower than 6°, such as 2° or some other angle, also been collected, a similar improvement in SNR effect would have been seen. The boxes shown in FIG. 11 can have a different tissue property (e.g., spin density values, T1 values, etc.). The tissue properties can be related to each other.

CROWN can offer a powerful tool to improve SNR without modifying or blurring the image structures as is the case in most other methods that purport to improve SNR. CROWN processing can lead to improved SNR not only in the original PD estimates but also for the original low and high flip angle images and any other images for any arbitrary flip angles or images from any other MRI pulse sequence. CROWN processing can work in conjunction with STAGE imaging, any other multi-flip angle approach, or any method that generates both a spin density map and T1 map. CROWN processing can be "scanner agnostic" by being successfully applied to two separate in vivo datasets from two separate scanners. However, for other field strengths, new coefficients can be determined since the T1 values for tissues can change for different field strengths. CROWN processing can be used in low field strength applications where the SNR is inherently worse.

The effects of iron content on T1 can be corrected. The relationship of R1 versus R=1/p can be reasonably well behaved when there is no iron present in the tissue. However, iron can change the R1 value of tissue. The R1 values of different tissues used to determine the linear coefficients a and b for CROWN processing can be under the assumption that no iron is present. If an incorrect relationship is forced onto the tissue, the expected outcome can be modified, correct tissue properties can be lost, and contrast in the images can be lost. The iron content of the different tissues can be used to correct the measured values of R1 before applying CROWN. A set of data from a healthy adult volunteer can be acquired on a 3T scanner in the example shown in FIGS. 16A-16B to calculate the R1 value as a function of water content for the different deep GM. The susceptibility (e.g., quantitative susceptibility), T1, and proton density can be measured for each of the different deep GM structures. The R1 value can be corrected to remove the T1 reducing nature of iron, which can act like a paramagnetic contrast agent in the tissue, and to find the pristine relationship between R1 and water content. The constraint function can include a component that accounts for a presence of iron in a tissue. For example, the relation between two or more variables can account for and be used to correct for the presence of iron.

Figure 16A:
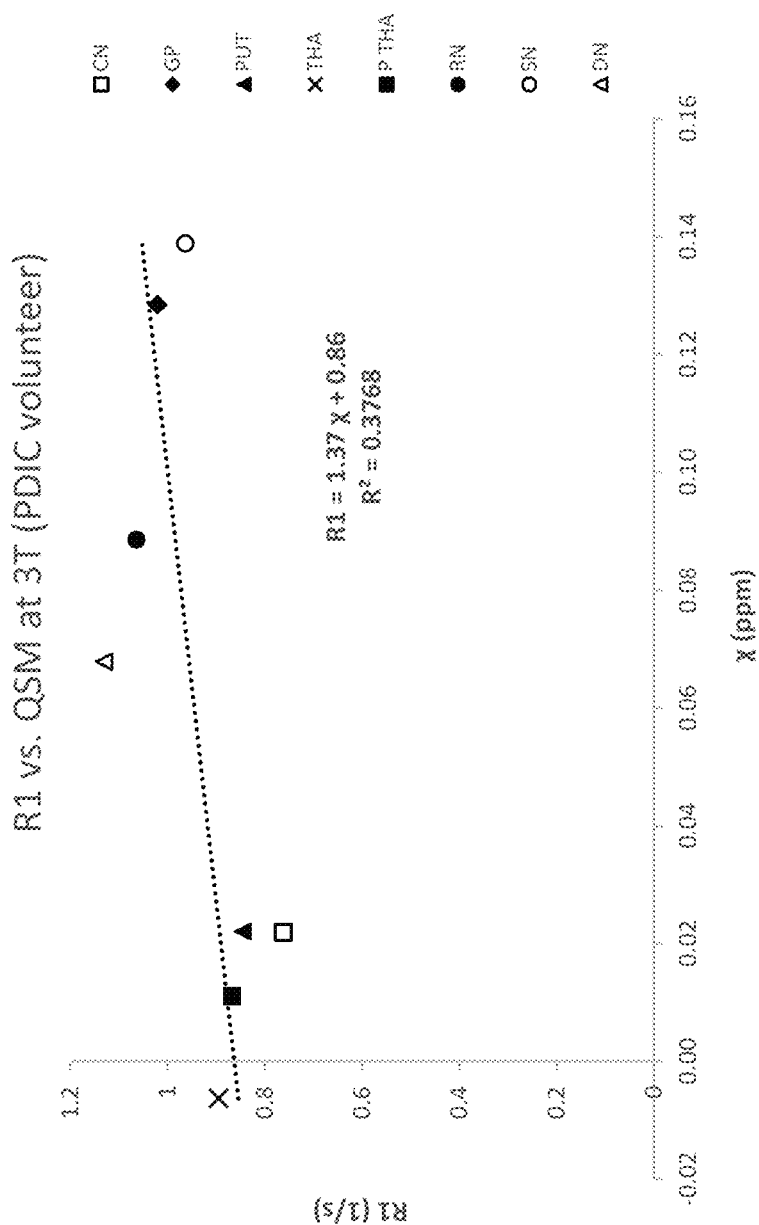
FIGS. 16A-16B illustrate the correction of the R1 value to remove the T1 reducing nature of iron, according to an embodiment.

To correct the effect of iron on T1 shortening, the relationship between R1 and susceptibility can be evaluated. As shown in FIG. 16A, the relationship between R1 and susceptibility at 3T for deep GM can be R1=1.37/sec/ppm*$_\chi$ (ppm)+0.86/sec. From this linear relation, the change in R1 from tissue to tissue can be related to the change in susceptibility via $\Delta R1$=1.37/sec/ppm*Ax (ppm). The corrected R1 can be calculated by subtracting $\Delta R1$ from the measured R1. The presence of iron can decrease the T1 values, but the proton density is not affected. Therefore, the relation between R1 and susceptibility can be used to correct the T1 reducing effect of iron.

Figure 16B:
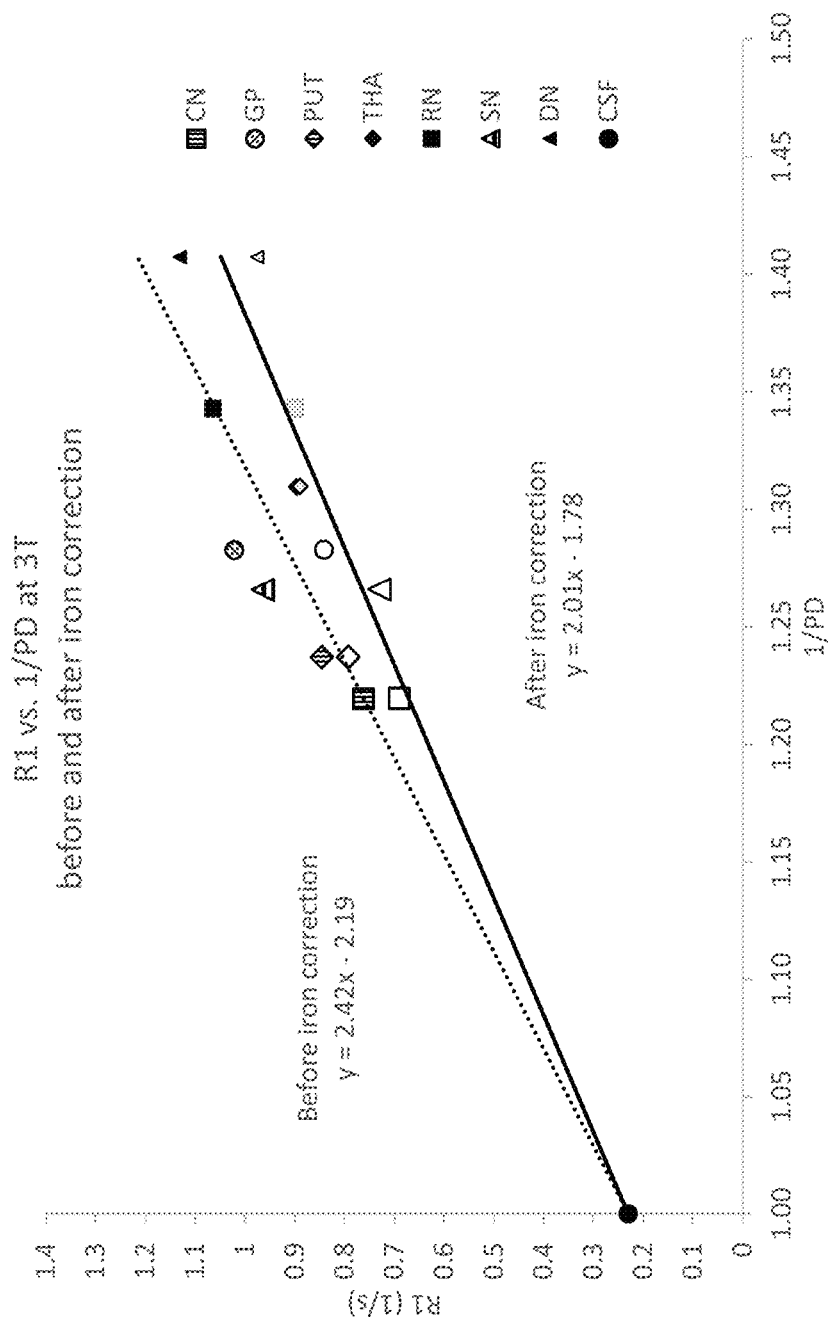

FIG. 16B shows that after iron correction, the slope of R1 vs. $\beta$ decreased from 2.42/sec to 2.01/sec and the intercept from 2.19/sec to 1.78/sec. The result from fitting to Table 1 and including WM as well which leads to the earlier formula that R1=2.03/sec*$\beta$−1.81/sec which can give a better fit for the T1 of cortical GM. When using CROWN, the formula for R1 that includes susceptibility effects becomes R1*$_{ironfree}$=R1$_{meas}$−$\Delta R1$=2.03/sec*$\beta$−1.81/sec.

Figure 17C:
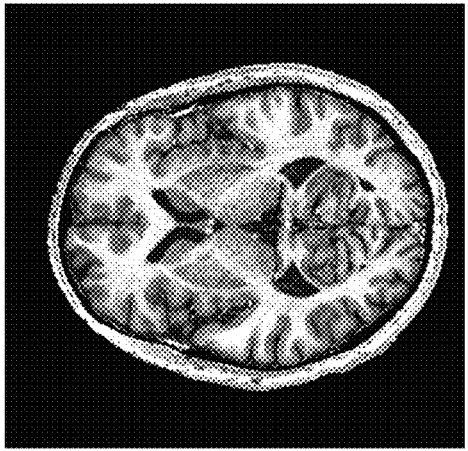
FIGS. 17A-17E illustrate an example of R1 before and after iron correction and the resulting PD maps produced from CROWN, according to an embodiment.
Figure 17E:
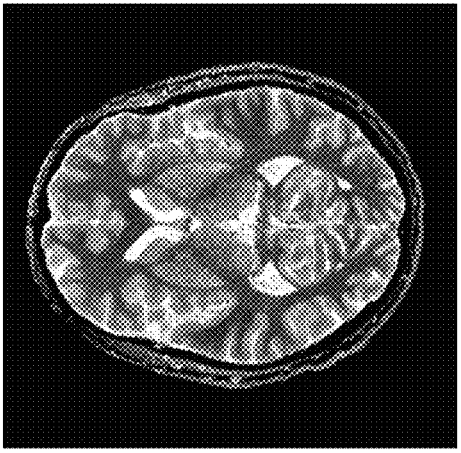
Figure 17B:
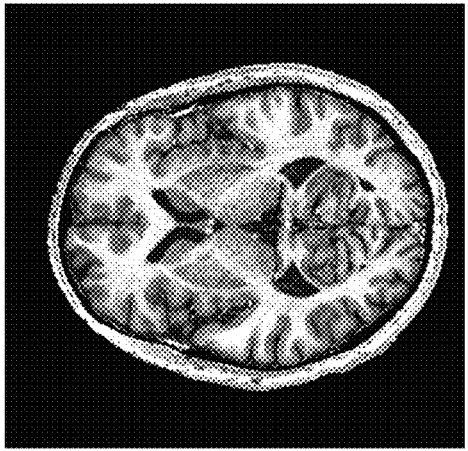
Figure 17A:
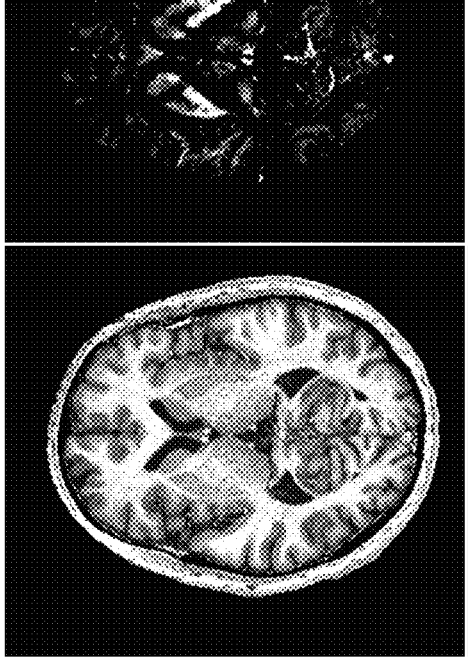
Figure 17D:
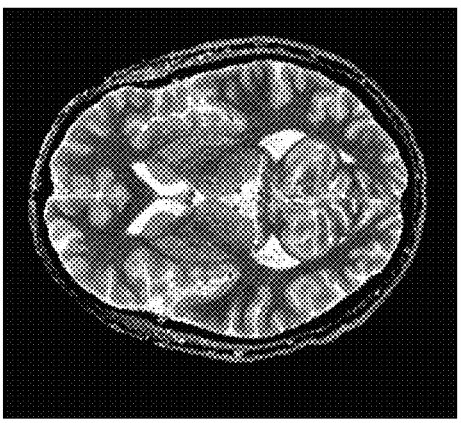

An example of R1 before and after the iron correction, along with the resulting PD maps produced from CROWN is shown in FIGS. 17A-17E. A comparison between using an R1 map, uncorrected for iron (FIG. 17A), to generate a CROWN PD map (FIG. 17D) versus using an R1 map, corrected for iron (FIG. 17C), to generate a CROWN PD map (FIG. 17E). Approach 2 depicted in FIG. 5 can be used to generate these PD maps. The R1 map can be the inverse of the STAGE T1 map depicted in FIG. 3C. The correction map, $\Delta R$=1.37/sec/ppm*$\Delta_\chi$ (ppm) can be seen in FIG. 17B using a threshold of 20 ppb. The 3T Siemens Prisma dataset can be used.

A threshold can be set below which the susceptibility is assumed to be zero. This can have a very small effect when the threshold is 25 ppb, for example, leading to only a 0.035/sec change in R1. This threshold can be chosen based on the inherent SNR in the QSM dataset. For a given noise level (e.g., as determined in the white matter or thalamus regions, for example), choosing the threshold to be 2 times the noise level can be acceptable while 3 times would be a more conservative approach to have less of an effect of noise on estimating the T1 change from iron content. The initial measurements of susceptibility, T1, and $\beta$, as well as the R1 and T1 values after correcting for the T1 reducing effect of iron are shown in Table 6.

|  | Initial measurements | | | | After iron correction | |
|---|---|---|---|---|---|---|
|  |  |  |  |  | Corrected R1: | |
|  | QSM (ppb) | $\beta$ | T1 (ms) | R1 (1/sec) | R1c = R1 − $\Delta R1$ | T1 (ms) |
| CN | 21.87 | 1.22 | 1311.75 | 0.762 | 0.73 | 1365.43 |
| GP | 128.50 | 1.28 | 978.79 | 1.022 | 0.85 | 1182.57 |
| PUT | 21.99 | 1.24 | 1182.31 | 0.846 | 0.82 | 1225.97 |
| THA | −6.36 | 1.31 | 1116.34 | 0.896 | 0.90 | 1105.59 |
| P THA | 11.00 | 1.29 | 1151.66 | 0.868 | 0.85 | 1172.01 |
| RN | 88.57 | 1.34 | 939.28 | 1.065 | 0.94 | 1060.10 |
| SN | 138.78 | 1.27 | 1037.34 | 0.964 | 0.77 | 1292.20 |
| DN | 67.87 | 1.41 | 884.00 | 1.131 | 1.04 | 963.17 |
| CSF | 0 | 1 | 4500 | 0.22 |  |  |

Table 6 illustrates the initial measurements of susceptibility, T1, and $\beta$, as well as the R1 and T1 values after correcting for the T1 reducing effect of iron.

Figure 18:
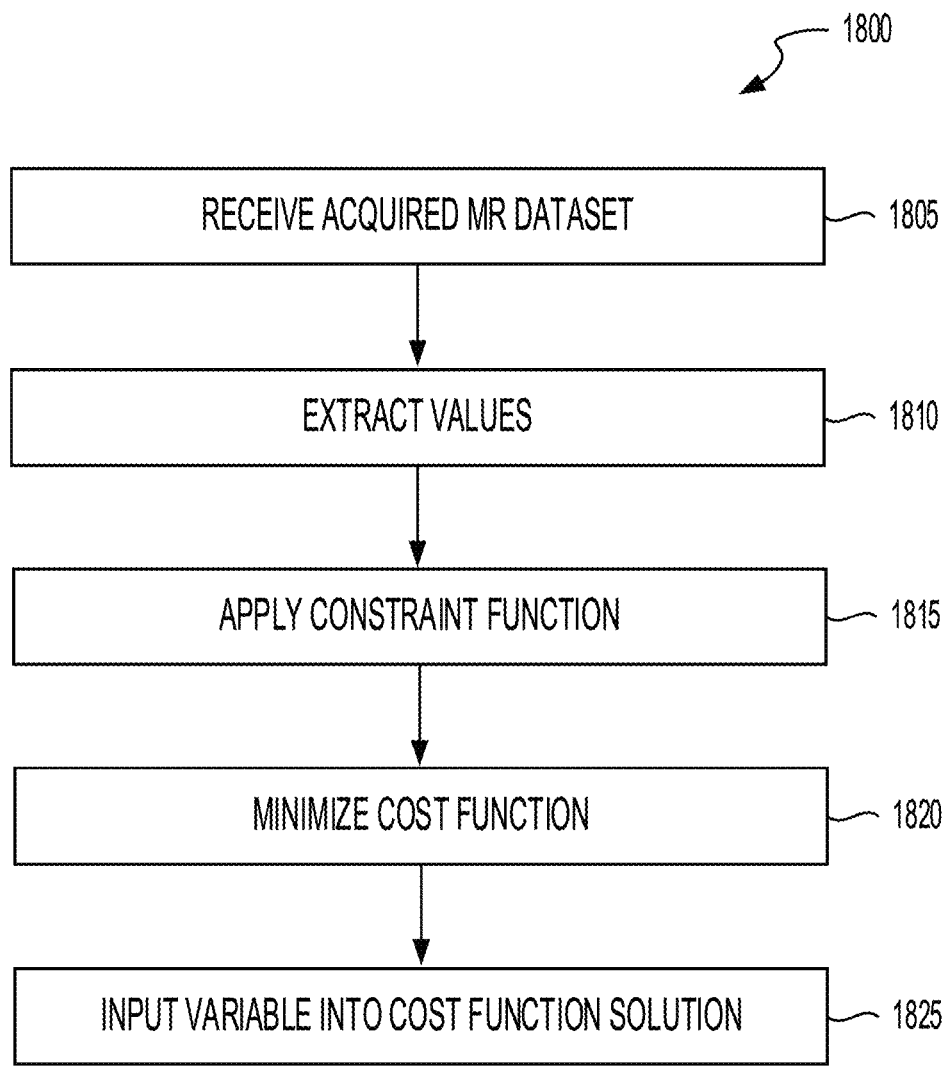
FIG. 18 illustrates a method of magnetic resonance imaging, according to an embodiment.

FIG. 18 illustrates a method of magnetic resonance imaging (MRI). In brief summary, the method 1800 can include receiving an acquired magnetic resonance (MR) dataset (BLOCK 1805). The method 1800 can include extracting a first set of values and a second set of values (BLOCK 1810). The method 1800 can include applying a constraint function (BLOCK 1815). The method 1800 can include minimizing a cost function (BLOCK 1820). The method 1800 can include inputting the first variable into the cost function (BLOCK 1825).

The method 1800 can include receiving an acquired MR dataset (BLOCK 1805). The acquired MR dataset can have a first SNR. The acquired MR dataset can include data corresponding to a first flip angle and a second flip angle. The acquired MR dataset can be acquired by imaging an anatomical region using at least one echo time The method 1800 can include extracting values (e.g., a first set of values and a second set of values) (BLOCK 1810). The first set of values can correspond to a first variable. The first variable can have a second SNR. The second set of values can correspond to a second variable. The method 1800 can include extracting, from the acquired MR dataset, a third set of values. The third set of values can correspond to a third variable. The first variable can correspond to the inverse of spin density and the second variable can correspond to the inverse of T1. The first variable can correspond to susceptibility and the second variable can correspond to R2*. The first variable can correspond to an inverse of spin density and the second variable can correspond to R2*.

The method 1800 can include applying a constraint function (BLOCK 1815). The constraint function can be a function of the first variable and the second variable. The constraint function can be a function of the first variable, the second variable, and the third variable. The constraint function can be a function of multiple variables. The constraint function can include a component that accounts for a presence of iron in a tissue. The constraint function can include a component that accounts for each echo time. The constraint function can include the constraint function described by Equation 1.

The method 1800 can include minimizing a cost function (BLOCK 1820). The cost function can be minimized according to the constraint function to generate a cost function solution. The cost function can include the cost function described by Equation 2.

The method 1800 can include inputting a variable (e.g., the first variable) into the cost function (BLOCK 1825). The first variable can be input into the cost function solution to generate a modified first variable having a third SNR. The third SNR can be greater than the second SNR. The method 1800 can include generating, using the modified first variable and the second variable, a simulated dataset for an arbitrary flip angle.

In some embodiments, the method 1800 can include generating a first calculated value of a third variable corresponding to R2*. The third variable can have a fourth SNR. The method 1800 can include generating, using the modified first variable, a second calculated value of a modified third variable. The modified third variable can have a fifth SNR. The fifth SNR can be greater than the fourth SNR.

In some embodiments, the method 1800 can include generating a first calculated value of a third variable corresponding to R2*. The third variable can have a fourth SNR. The method 1800 can include using the first modified first variable at each of the at least two echo times and the third variable to generate a second modified first variable. The method 1800 can include using (e.g., apply) the second modified first variable at each of the at least two echo times and the second variable as inputs into the cost function solution to generate a third modified first variable having a sixth SNR. The sixth SNR can be greater than the third SNR.

In some embodiments, the method 1800 can include generating a second calculated value of the third variable corresponding to R2*. The third variable can have a seventh SNR. The seventh SNR can be greater than the fourth SNR. In some embodiments, the method 1800 can include generating, using the modified first variable, a simulated MR dataset having an eighth SNR. The eighth SNR can be greater than the first SNR.

In some embodiments, the acquired MR dataset includes a first set of echo times. The method 1800 can include generating, using the modified first variable and the second variable and a modified third variable, a simulated MR dataset. The simulated MR dataset can include a second set of echo times. The second set of echo times can be different from the first set of echo times.

In some embodiments, the acquired MR dataset includes data corresponding to a first flip angle and a second flip angle for a plurality of echo times. The method 1800 can include generating a weighted average value for at least one of the first variable and the modified first variable over the plurality of echo times. In some embodiments, the method 1800 can include generating a spin density image.

Embodiments of the subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatus. Alternatively, or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices).

The operations described in this specification can be performed by a data processing apparatus on data stored on one or more computer-readable storage devices or received from other sources. The term "data processing apparatus" or "computing device" encompasses various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a circuit, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more circuits, subprograms, or portions of code). A computer program can be deployed to be executed on one computer or on multiple computers that are located at one site or distributed across multiple sites and interconnected by a communication network.

Processors suitable for the execution of a computer program include, by way of example, microprocessors, and any one or more processors of a digital computer. A processor can receive instructions and data from a read only memory or a random access memory or both. The elements of a computer are a processor for performing actions in accordance with instructions and one or more memory devices for storing instructions and data. A computer can include, or be operatively coupled to receive data from or transfer data to, or both, one or more mass storage devices for storing data, e.g., magnetic, magneto optical disks, or optical disks. A computer need not have such devices. Moreover, a computer can be embedded in another device, e.g., a personal digital assistant (PDA), a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The implementations described herein can be implemented in any of numerous ways including, for example, using hardware, software or a combination thereof. When implemented in software, the software code can be executed on any suitable processor or collection of processors, whether provided in a single computer or distributed among multiple computers.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to or receive communications from other devices. The display unit(s) may be provided, for example, to allow a user to view various information in connection with execution of the instructions. The user input device(s) may be provided, for example, to allow the user to make manual adjustments, make selections, enter data or various other information, or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the solution discussed above. The computer readable medium or media can be transportable, such that the program or programs stored thereon can be loaded onto one or more different computers or other processors to implement various aspects of the present solution as discussed above.

The terms "program" or "software" are used herein to refer to any type of computer code or set of computer-executable instructions that can be employed to program a computer or other processor to implement various aspects of embodiments as discussed above. One or more computer programs that when executed perform methods of the present solution need not reside on a single computer or processor, but may be distributed in a modular fashion amongst a number of different computers or processors to implement various aspects of the present solution.

Computer-executable instructions may be in many forms, such as program modules, executed by one or more computers or other devices. Program modules can include routines, programs, objects, components, data structures, or other components that perform particular tasks or implement particular abstract data types. The functionality of the program modules can be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Any references to implementations or elements or acts of the systems and methods herein referred to in the singular can include implementations including a plurality of these elements, and any references in plural to any implementation or element or act herein can include implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementations," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B,'" can include only 'A', only 'B', as well as both 'A' and 'B'. Elements other than 'A' and 'B' can also be included.

The systems and methods described herein may be embodied in other specific forms without departing from the characteristics thereof. The foregoing implementations are illustrative rather than limiting of the described systems and methods.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A magnetic resonance imaging (MRI) system, comprising:
   at least one processor;
   a memory, with computer code instructions stored thereon, the computer code instructions, when executed by the at least one processor, cause the at least one processor to:
      receive an acquired magnetic resonance (MR) dataset having a first signal-to-noise ratio (SNR);
      extract, from the acquired MR dataset, a first set of values corresponding to a first variable having a second SNR and a second set of values corresponding to a second variable;
      apply a constraint function which comprises a function of the first variable corresponding to the first set of values extracted from the acquired MR dataset, and the second variable corresponding to the second set of values extracted from the acquired MR dataset;
      minimize a cost function according to the constraint function to generate a cost function solution; and
      input the first variable corresponding to the first set of values extracted from the acquired MR dataset and the second variable corresponding to the second set of values extracted from the acquired MR dataset, into the cost function solution to generate a modified first variable corresponding to a simulated MR dataset that is different from the acquired MR dataset, the modified first variable having a third SNR that is greater than the second SNR.

2. A method of magnetic resonance imaging (MRI), comprising:
   receiving, by at least one processor, an acquired magnetic resonance (MR) dataset having a first signal-to-noise ratio (SNR);
   extracting, from the acquired MR dataset by the at least one processor, a first set of values corresponding to a first variable having a second SNR and a second set of values corresponding to a second variable;
   applying, by the at least one processor, a constraint function which comprises a function of the first variable corresponding to the first set of values extracted from the acquired MR dataset, and the second variable corresponding to the second set of values extracted from the acquired MR dataset;
   minimizing, by the at least one processor, a cost function according to the constraint function to generate a cost function solution; and
   inputting, by the at least one processor, the first variable corresponding to the first set of values extracted from the acquired MR dataset and the second variable corresponding to the second set of values extracted from the acquired MR dataset, into the cost function solution to generate a modified first variable corresponding to a simulated MR dataset that is different from the acquired MR dataset, the modified first variable having a third SNR that is greater than the second SNR.

3. The MRI system of claim 1, wherein the computer code instructions, when executed by the at least one processor, cause the at least one processor to:
   extract from the acquired MR dataset, a third set of values corresponding to a third variable; and
   apply the constraint function which comprises a function of the first variable, the second variable, and the third variable.

4. The MRI system of claim 1, wherein:
the acquired MR dataset comprises data corresponding to a first flip angle and a second flip angle; and
the acquired MR dataset is acquired by imaging an anatomical region using at least one echo time.

5. The MRI system of claim 1, wherein the first variable corresponds to a reciprocal of spin density and the second variable corresponds to a reciprocal of T1.

6. The MRI system of claim 1, wherein the first variable corresponds to susceptibility and the second variable corresponds to R2*.

7. The MRI system of claim 1, wherein the first variable corresponds to a reciprocal of spin density and the second variable corresponds to R2*.

8. The MRI system of claim 1, wherein the computer code instructions, when executed by the at least one processor, cause the at least one processor to:
generate, using the modified first variable and the second variable, the simulated MR dataset for an arbitrary flip angle.

9. The MRI system of claim 1, wherein:
the acquired MR dataset comprises data corresponding to a first flip angle and a second flip angle;
the acquired MR dataset is acquired by imaging an anatomical region using at least two echo times; and
the computer code instructions, when executed by the at least one processor, cause the at least one processor to:
generate a first calculated value of a third variable corresponding to R2*, the third variable having a fourth SNR; and
generate, using the modified first variable, a second calculated value of a modified third variable, the modified third variable having a fifth SNR, the fifth SNR being greater than the fourth SNR.

10. The MRI system of claim 1, wherein:
the acquired MR dataset comprises data corresponding to a first flip angle and a second flip angle;
the acquired MR dataset is acquired by imaging an anatomical region using at least two echo times;
the modified first variable is a first modified first variable; and
the computer code instructions, when executed by the at least one processor, cause the at least one processor to:
generate a first calculated value of a third variable corresponding to R2*, the third variable having a fourth SNR;
use the first modified first variable at each of the at least two echo times and the third variable to generate a second modified first variable; and
use the second modified first variable at each of the at least two echo times and the second variable as inputs into the cost function solution to generate a third modified first variable having a sixth SNR, the sixth SNR being greater than the third SNR.

11. The MRI system of claim 10, wherein:
the computer code instructions, when executed by the at least one processor, cause the at least one processor to:
generate a second calculated value of the third variable corresponding to R2*, the third variable having a seventh SNR, the seventh SNR being greater than the fourth SNR.

12. The MRI system of claim 1, wherein the constraint function includes a component that accounts for a presence of iron in a tissue.

13. The MRI system of claim 1, wherein the constraint function includes a component that accounts for each echo time.

14. The MRI system of claim 1, wherein the computer code instructions, when executed by the at least one processor, cause the at least one processor to:
generate, using the modified first variable, the simulated MR dataset having an eighth SNR, the eighth SNR being greater than the first SNR.

15. The MRI system of claim 1, wherein:
the acquired MR dataset comprises a first set of echo times; and
the computer code instructions, when executed by the at least one processor, cause the at least one processor to:
generate, using the modified first variable and the second variable and a modified third variable, the simulated MR dataset comprising a second set of echo times, the second set of echo times being different from the first set of echo times.

16. The MRI system of claim 1, further comprising:
a third set of values corresponding to the acquired MR dataset at a set of positions, wherein a subset of the third set of values satisfies a predetermined threshold, the subset of the third set of values comprising a subset of the set of positions;
the simulated MR dataset comprising a fourth set of values at the subset of the set of positions; and
wherein the computer code instructions, when executed by the at least one processor, cause the at least one processor to:
replace the fourth set of values at the set of positions with the subset of the third set of values at the set of positions.

17. The MRI system of claim 1, wherein:
the acquired MR dataset comprises data corresponding to a first flip angle and a second flip angle for a plurality of echo times; and
the computer code instructions, when executed by the at least one processor, cause the at least one processor to:
generate a weighted average value for at least one of the first variable and the modified first variable over the plurality of echo times.

18. The MRI system of claim 1, wherein:
the computer code instructions, when executed by the at least one processor, cause the at least one processor to:
generate a spin density image.

19. The method of claim 2, further comprising:
generating, by the at least one processor and using the modified first variable and the second variable, the simulated MR dataset for an arbitrary flip angle.

20. The method of claim 2, wherein the acquired MR dataset comprises data corresponds to a first flip angle and a second flip angle and the acquired MR dataset is acquired by imaging an anatomical region using at least two echo times, the method further comprising:
generating, by the at least one processor, a first calculated value of a third variable corresponding to R2*, the third variable having a fourth SNR; and
generating, by the at least one processor and using the modified first variable, a second calculated value of a modified third variable, the modified third variable having a fifth SNR, the fifth SNR being greater than the fourth SNR.

21. The method of claim 2, wherein the acquired MR dataset comprises data corresponds to a first flip angle, a second flip angle and the acquired MR dataset is acquired by imaging an anatomical region using at least two echo times, and the modified first variable is a first modified first variable, the method further comprising:

generating, by the at least one processor, a first calculated value of a third variable corresponding to R2*, the third variable having a fourth SNR;

using, by the at least one processor, the first modified first variable at each of the at least two echo times and the third variable to generate a second modified first variable; and using, by the at least one processor, the second modified first variable at each of the at least two echo times and the second variable as inputs into the cost function solution to generate a third modified first variable having a sixth SNR, the sixth SNR being greater than the third SNR.

22. The method of claim 2, further comprising:

generating, by the at least one processor and using the modified first variable, the simulated MR dataset having an eighth SNR, the eighth SNR being greater than the first SNR.

\* \* \* \* \*